United States Patent [19]
Sato

[11] Patent Number: 6,103,449
[45] Date of Patent: Aug. 15, 2000

[54] NEGATIVE WORKING PHOTORESIST COMPOSITION

[75] Inventor: Kenichiro Sato, Shizuoka, Japan

[73] Assignee: Fuji Photo Film Co., Ltd., Tokyo, Japan

[21] Appl. No.: 09/229,684

[22] Filed: Jan. 13, 1999

[30] Foreign Application Priority Data

Feb. 3, 1998 [JP] Japan .................................. 10-022168

[51] Int. Cl.$^7$ .................................................. G03F 7/004
[52] U.S. Cl. ........................................................ 430/270.1
[58] Field of Search .......................................... 430/270.1

[56] References Cited

U.S. PATENT DOCUMENTS

| | | | |
|---|---|---|---|
| 4,571,375 | 2/1986 | Benedikt ................................. | 430/197 |
| 5,843,624 | 12/1998 | Houlihan et al. ....................... | 430/296 |
| 5,932,391 | 8/1999 | Ushirogouchi et al. ............. | 430/270.1 |
| 6,027,856 | 2/2000 | Nozaki et al. ....................... | 430/281.1 |

FOREIGN PATENT DOCUMENTS 789278  8/1997  European Pat. Off. ........ G03F 7/004

OTHER PUBLICATIONS

"Alicyclic Polymers . . . ", Okoroanyanwu, U. et al, Oct. 22, 1998, 10, pp. 3319–3327.

Primary Examiner—Janet Baxter
Assistant Examiner—Rosemary Ashton
Attorney, Agent, or Firm—Sughrue, Mion, Zinn, Macpeak & Seas, PLLC

[57] ABSTRACT

A negative working photoresist composition which has high suitability for exposure to far ultraviolet and comprises an alkali-soluble resin, a compound capable of generating an acid upon irradiation with actinic rays or radiations, and a compound capable of lowering the solubility of the alkali-soluble resin in a developer in the presence of the acid, the alkali-soluble resin comprising a polymer containing at least the repeating units derived from norbornene skeleton-containing monomers and crosslinking groups.

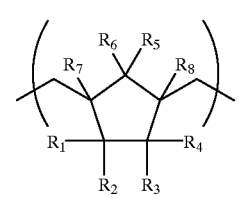

[I]

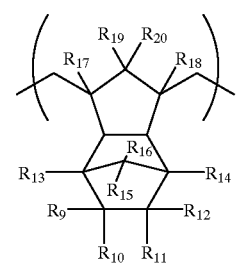

[II]

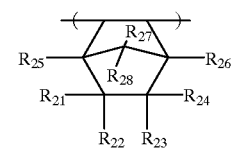

[I']

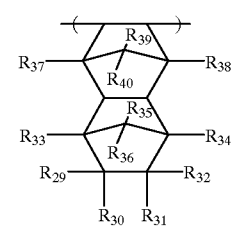

[II']

2 Claims, No Drawings

NEGATIVE WORKING PHOTORESIST COMPOSITION

FIELD OF THE INVENTION

The present invention relates to a negative working photoresist composition used in an ultramicrolithographic process for producing VLSI, high capacity microchips and the like, and other photofabrication processes. More particularly, the invention relates to a negative working photoresist composition capable of forming highly precise patterns by using far ultraviolet light region, including excimer laser beams.

BACKGROUND OF THE INVENTION

In recent years, integrated circuits have become heightened in degree of integration, so that the microlithography for superfine patterns having a line width of half micron or below has come to be required in the production of semiconductor substrates for VLSI and the like. In order to meet such a requirement, the wavelengths used in an exposure apparatus for photolithography were getting shorter, and nowadays the use of far ultraviolet light in shorter wavelength region, or excimer laser beams (XeCl, KrF, ArF), is being investigated.

As the investigation progresses, it is of urgent necessity to develop new resist materials having less absorption at the above short wavelengths, satisfactory sensitivity and high dry-etching resistance. In particular, the exposure method using ArF excimer laser (wavelength: 193 nm) or the like is under consideration, and there is a pressing need of developing resist materials having excellent sensitivity and resolution in such a short wavelength region.

The chemically non-amplified resist composition described in JP-A-8-262717 (the term "JP-A" as used herein means an "unexamined published Japanese patent application") is a resist composition having high dry-etching resistance, but this composition cannot answer the purpose of practical use because it has drawbacks in sensitivity, profile, adhesiveness to a substrate used for pattern formation and so on.

Further, the chemically amplified resist described in JP-A-6-214388, which comprises an acid generator, a crosslinking agent and a specific polyhydroxyl compound, is a negative working photoresist having high resolution. However, this negative working photoresist is insufficient in transparency and has drawbacks in sensitivity and profile, and so it is unsatisfactory from practical point of view.

SUMMARY OF THE INVENTION

Therefore, an object of the present invention is to overcome the above-described problems confronting the art of improving the original performance of the microphotofabrication using far ultraviolet light, particularly excimer laser beams, and to provide resist compositions having high adhesiveness to substrates and high sensitivity and ensuring other desired characteristics in, e.g., the pattern profile.

Of such compositions, the resist composition that the present invention aims in particular to provide is a negative working photoresist composition which is suitable for exposure to ArF excimer laser, has excellent adhesiveness to a substrate and can ensure satisfactory resist profile.

As a result of the intensive studies on ingredients of a negative working resist composition of chemical amplification type, it has been found that the above object can be attained with the combination of an alkali-soluble resin comprising polymers having specific structures as structural units, a photoacid generator and a compound capable of lowering the solubility of the alkali-soluble resin in a developer in the presence of the acid, thereby achieving the invention.

The above object can be achieved by the following embodiments.

According to a first embodiment of the present invention, there is provided a negative working photoresist composition comprising:

an alkali-soluble resin, a compound capable of generating an acid upon irradiation with actinic rays or radiations, and a compound capable of lowering the solubility of the alkali-soluble resin in a developer in the presence of the acid, wherein the alkali-soluble resin comprises a polymer containing at least one of repeating units represented by the following formulae [I] and [II], and crosslinking groups:

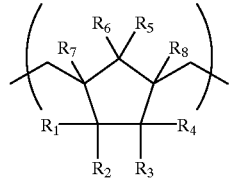

[I]

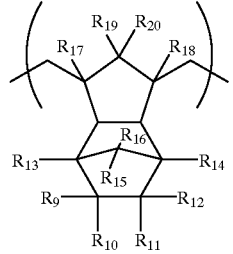

[II]

wherein $R_1$ to $R_4$ and $R_9$ to $R_{12}$ each independently represent a hydrogen atom, an alkyl group which may have substituents, a halogen atom, a hydroxyl group, an alkoxy group which may have substituents, —COOH, —COOR$_{41}$, —CN or —XO—X—A—R$_{50}$;

$R_5$ to $R_8$ and $R_{13}$ to $R_{20}$ each independently represent a hydrogen atom, an alkyl group which may have substituents, or an alkoxy group which may have substituents;

$R_{41}$ represents an alkyl group which may have substituents, or —Y of the following formula:

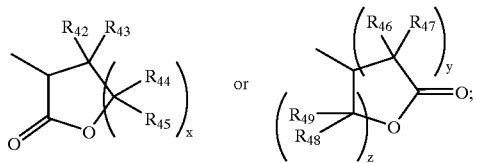

$R_{42}$ to $R_{49}$ each independently represent a hydrogen atom or an alkyl group which may have substituents;

X represents a divalent linkage group selected from the group consisting of —O—, —S—, —NH—, —NHSO$_2$— and —NHSO$_2$NH—;

A represents a single bond or a group selected from the group consisting of an alkylene group, a substituted alkylene group, an ether group, a thioether group, a carbonyl group, an ester group, an amido group, a sulfonamido group, an urethane group and a urea group, or a combination of two or more of those groups;

$R_{50}$ represents a hydrogen atom, an alkyl group, a cycloalkyl group, —COOH, —CN, a hydroxyl group, an unsubstituted or substituted alkoxy group, —CO—NH—$R_{30}$, —CO—NH—$SO_2$—$R_{30}$, —COO$R_{35}$ or the above-described Y;

$R_{30}$ represents an alkyl group which may have substituents, or an alkoxy group which may have substituents;

$R_{35}$ represents an alkyl group which may have substituents, an alkoxy group which may have substituents, or the above-described Y; and x, y and z are each 1 or 2.

According to a second embodiment of the present invention, there is provided a negative photoresist composition comprising an alkali-soluble resin, a compound capable of generating an acid upon irradiation with actinic rays or radiations and a compound capable of lowering the solubility of the alkali-soluble resin in a developer in the presence of the acid, wherein the alkali-soluble resin comprises a polymer containing at least one of repeating units represented by the following formulae [I'], and crosslinking groups:

[I']

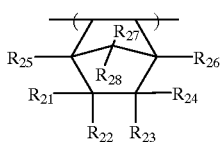

[II']

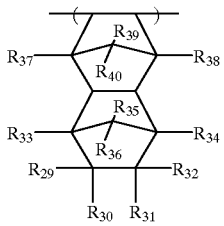

wherein $R_{21}$ to $R_{24}$ and $R_{29}$ to $R_{32}$ each independently represent a hydrogen atom, an alkyl group, a halogen atom which may have substituents, a hydroxyl group, an alkoxy group which may have substituents, —COOH, —COO$R_{41}$, —CN or —XO—X—A—$R_{50}$;

$R_{25}$ to $R_{28}$ and $R_{33}$ to $R_{40}$ each independently represent a hydrogen atom, an alkyl group which may have substituents, or an alkoxy group which may have substituents;

$R_{41}$ is the same as defined in the first embodiment;
X is the same as defined in the first embodiment;
A is the same as defined in the first embodiment; and
$R_{50}$ is the same as defined in the first embodiment.

DETAILED DESCRIPTION OF THE INVENTION

The compounds used in the present invention are explained in detail below.

First, the alkali-soluble resin used in the present invention is described in detail, which comprises a polymer containing at least one of repeating units represented by the above-described formulae [I] and [II], or at least one of repeating units represented by the above-described formulae [I'] and [II'], and crosslinking groups.

In the formula [I] or [II], of formula [I'] or [II'], the alkyl group which may have a substituent is preferably straight-chain and branched alkyl groups having 1 to 10 carbon atoms, more preferably straight-chain and branched alkyl groups having 1 to 6 carbon atoms, and most preferably methyl, ethyl, propyl, isopropyl, n-butyl, isobutyl, sec-butyl and t-butyl groups.

The alkoxy group which may have a substituent is alkoxy groups having 1 to 4 carbon atoms, and examples thereof include methoxy, ethoxy, propoxy and butoxy groups.

Examples of the substituent in the substituted alkyl and alkoxy groups include a hydroxyl group, a halogen atom, an alkoxy group and a cyano group. Examples of the alkoxy group as the substituent include those having 1 to 4 carbon atoms, such as methoxy, ethoxy, propoxy and butoxy groups.

Examples of a cycloalkyl group include cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl and tetracyclododecanyl groups.

Examples of the halogen atom in the present invention include chlorine, bromine, iodine and fluorine atoms.

Examples of the alkylene group and the substituted alkylene group represented by A include the groups of the following formula:

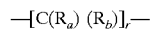

wherein $R_a$ and $R_b$, which may be the same or different, each represent a hydrogen atom, an alkyl group, a substituted alkyl group, a halogen atom, a hydroxyl group or an alkoxy group.

Suitable examples of the alkyl group as $R_a$ or $R_b$ include lower alkyl groups, such as methyl, ethyl, propyl, isopropyl and butyl groups. Of these groups, a group selected from the group consisting of methyl, ethyl, propyl and isopropyl groups is more preferred. Examples of the substituent in the substituted alkyl group include a hydroxyl group, a halogen atom and an alkoxy group. Suitable examples of the alkoxy group as $R_a$ or $R_b$ include lower alkoxy groups having 1 to 4 carbon atoms, such as methoxy, ethoxy, propoxy and butoxy groups. r is an integer of 1 to 10.

The alkali-soluble resin of the present invention characterizes to contain one kind or two or more kinds of at least one of the repeating units represented by the above-described formula [I] and formula [II], or one kind or two or more kinds of at least one repeating units represented by the above-described formulae [I'] and formula [II']. By this characteristic, the negative working photoresist composition can be obtained, which is satisfied with necessary properties such as adhesiveness to a substrate, pattern profile and sensitivity, and also possesses production suitability.

The alkali-soluble resin can be obtained by polymerizing monomer(s) having a norbornene skeleton and, if necessary, further conducting a polymer reaction. Regarding the polymerization reaction, the resin can be obtained by a general radical polymerization using a radical initiator, such as an azo initiator, but the resin is preferably synthesized by a ring non-opening polymerization using a Pd catalyst or the like, or a ring opening polymerization using a coordination polymerization catalyst, such as a transition metal complex. The resins obtained by the ring opening polymerization is preferably used after reduction from the standpoints of their stability and optical absorption.

The resins having at least one of repeating units of the above-described formulae [I] and [II] is obtained by the ring opening polymerization, and the resins having at least one of the repeating units of the above-described formulae [I'] and [II'] is obtained by the ring non-opening polymerization.

The alkali-soluble resin of the present invention is basically a polymer containing one kind or two more kinds of at least one of the repeating units represented by the formulae [I] and [II], or the formulae [I'] and [II'], but the resin can be a copolymer with various monomer repeating units for the purpose of controlling dry etching resistance, adhesion to a substrate and resist profile, and also resolving power, heat resistance, sensitivity and the like which are general essential requirements for resist.

Preferable copolymerizable components include repeating units represented by the following formulae [V] and [VI] (ring opening polymerization type), and those represented by the following formulae [V'] and [VI'] (ring non-opening polymerization type):

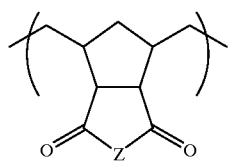
[V]

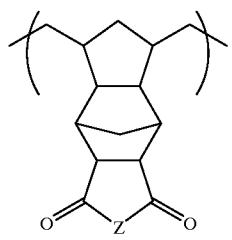
[VI]

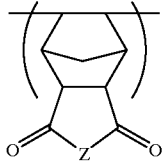
[V']

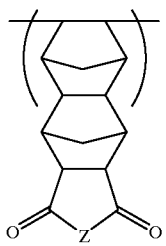
[VI']

wherein Z represents an oxygen atom, —NH—, —N(R$_{30}$)— or —N(OSO$_2$R$_{30}$)—, and R$_{30}$ is the same as defined above.

Of the repeating units of formula [I], the repeating units represented by the following formulae [I-a] and [III-a] respectively are preferable. Of the repeating units of formula [II], the repeating units represented by the following formulae [II-a] and [IV-a] are preferable.

Of the repeating units of formula [I'], the repeating units represented by the following formulae [I'-a] and [III'-a] respectively are preferable. Of the repeating units of formula [II'], the repeating units represented by the following formulae [II'-a] and [IV'-a] are preferable.

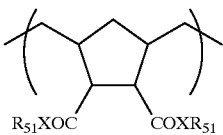
[I-a]

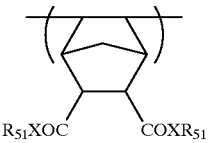
[I'-a]

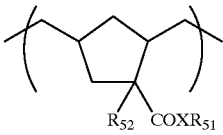
[III-a]

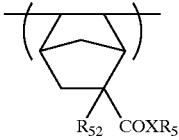
[III'-a]

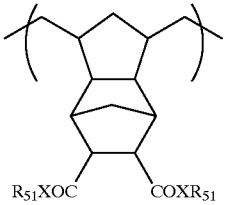
[II-a]

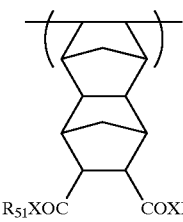
[II'-a]

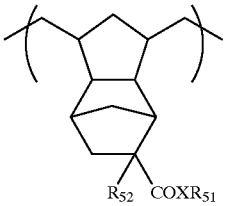
[IV-a]

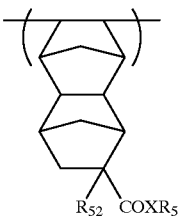
[IV'-a]

In the above formulae, R$_{51}$ represents a hydrogen atom, R$_{41}$ or —A—R$_{50}$; X represents an oxygen atom when R$_{51}$ is a hydrogen atom or $R_{41}$, while X is the same as defined above when $R_{51}$ is —A—$R_{50}$; $R_{41}$ and $R_{50}$ are the same as defined above; and $R_{52}$ represents a hydrogen atom, an alkyl group which may have a substituent, a halogen atom, a cyano group or a hydroxyl group.

Suitable examples of a combination of repeating units in each of the present alkali-soluble resins include:

a combination of repeating units of formulae [I-a] and [II-a], a combination of repeating units of formulae [I-a] and [IV-a], a combination of repeating units of formulae [III-a] and [II-a], a combination of repeating units of formulae [III-a] and [IV-a], a combination of repeating units of formulae [I-a], [II-a] and [III-a], a combination of repeating units of formulae [I-a], [II-a] and [IV-a], a combination of repeating units of formulae [I-a], [III-a] and [IV-a], a combination of repeating units of formulae [II-a], [III-a] and [IV-a], a combination of repeating units of formulae [I'-a] and [II'-a], a combination of repeating units of formulae [I'-a] and [IV'-a], a combination of repeating units of formulae [III'-a] and [II'-a], a combination of repeating units of formulae [III'-a] and [IV'-a], a combination of repeating units of formulae [I'-a], [II'-a] and [III'-a], a combination of repeating units of formulae [I'-a], [II'-a] and [IV'-a], a combination of repeating units of formulae [I'-a], [III'-a] and [IV'-a], and a combination of repeating units of formulae [II'-a], [III'-a] and [IV'-a].

The alkali-soluble resins containing the repeating units as recited above are required to have crosslinking groups at certain positions of homo- or copolymers. Examples of such a crosslinking group include a carboxyl group and a hydroxyl group.

The preferred crosslinking group is a carboxyl group, and this group also functions as an alkali-soluble group. In the case of choosing a carboxyl group as crosslinking group, hydroxyl groups may further be present in the polymers.

In the present invention, at least one of the crosslinking groups is contained in the formula [I] or [II]; either of $R_1$ to $R_4$ and $R_9$ to $R_{12}$, or $R_{21}$ to $R_{24}$ and $R_{29}$ to $R_{32}$, of the formula [I'] or [II']; or the copolymer component.

The molar ratio of the repeating units contained can appropriately be determined in order to control adhesion of resist to a substrate, dry etching resistance of resist, resist profile, and general essential requirements for resist, including resolving power, heat resistance and sensitivity.

However, the content of the repeating units represented by formula [I] or [II], or the repeating units represented by formula [I'] or [II'] in the resin is at least 10 mole %, preferably at least 20 mole %, and more preferably at least 30 mole %, to the total monomer repeating units.

Where the crosslinking groups are carboxyl groups, the content of the crosslinking groups in the resin is from 1.5 to 4.0 meq/g, preferably from 1.55 to 3.8 meq/g, and more preferably from 1.6 to 3.5 meq/g, in terms of the equivalent number of carboxylic acid present in 1 g of resin. When carboxyl groups and hydroxyl groups are used together, the content of hydroxyl groups in the resin is 10 meq/g or less, preferably 9 meq/g or less, and more preferably 8 meq/g or less, in terms of hydroxyl value.

The following show examples [I-a-1] to [I-a-40], [II-a-1] to [II-a-40], [III-a-1] to [III-a-32] and [IV-a-1] to [IV-a-34] of the repeating units represented by the formulae [I-a], [II-a], [III-a] and [IV-a], respectively, which constitute the alkali-soluble resin of the present invention, obtained by ring opening polymerization and reduction in combination and further, if necessary, a polymer reaction, and preferable copolymerizing components [V-1] to [V-8] and [VI-1] to [VI-8], but the invention is not limited to those.

The following also show examples [I'-a-41] to [I'-a-80], [II'-a-41] to [II'-a-80], [III'-a-33] to [III'-a-64] and [IV'-a-35] to [IV'-a-68] of the repeating units represented by the formulae [I'-a], [II'-a], [III'-a] and [VI'-a], respectively which constitute resins which decompose by the action of an acid thereon to increase the solubility in an alkali, obtained by general olefin polymerization of ring non-opening type and further a polymer reaction, and preferable copolymerizing components [V'-9] to [V'-16] and [VI'-9] to [VI'-16], but the present invention is not limited to those.

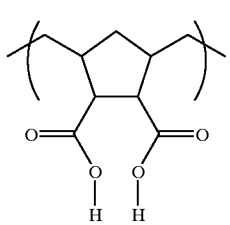

[I-a-1]

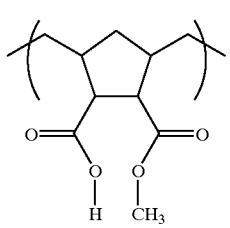

[I-a-2]

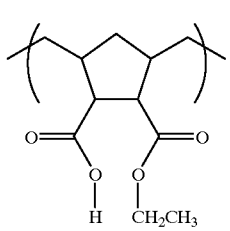

[I-a-3]

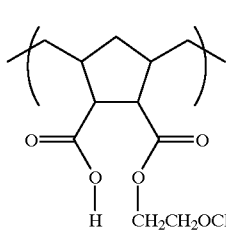

[I-a-4]

[I-a-5] 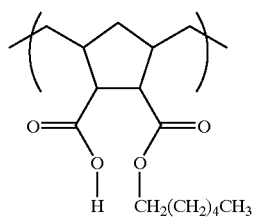
[I-a-6] 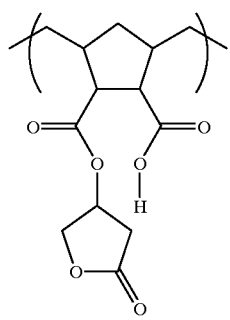
[I-a-7] 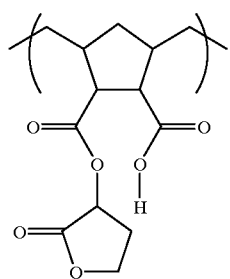
[I-a-8] 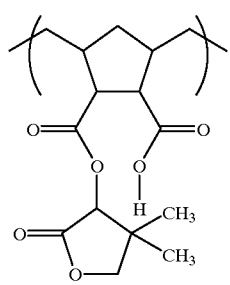
[I-a-9] 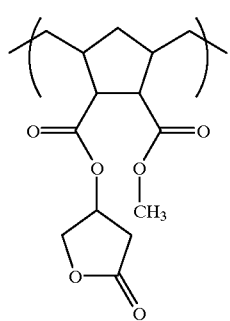
[I-a-10] 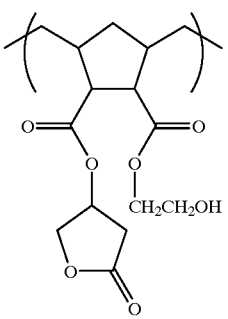
[I-a-11] 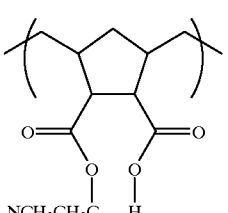
[I-a-12] 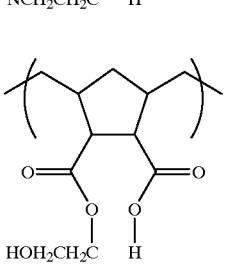
[I-a-13] 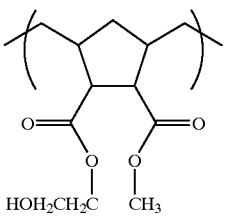
[I-a-14] 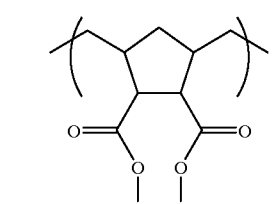
[I-a-15] 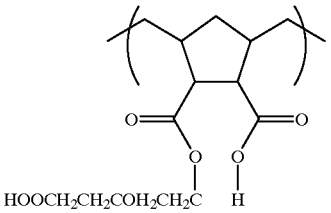

[I-a-16]
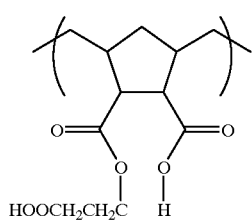
[I-a-17]
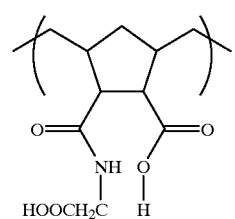
[I-a-18]
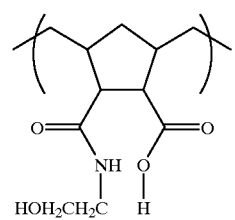
[I-a-19]
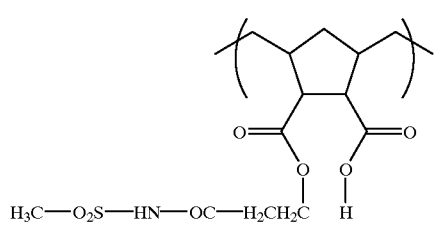
[I-a-20]
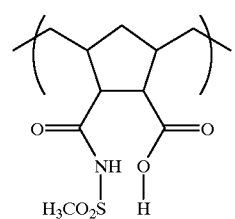
[I-a-21]
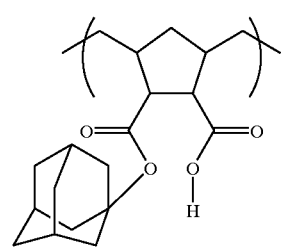
[I-a-22]
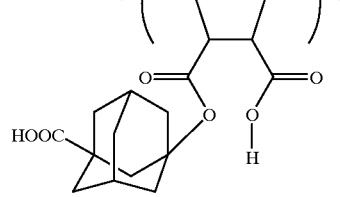
[I-a-23]
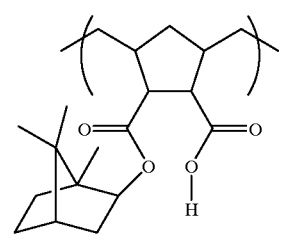
[I-a-24]
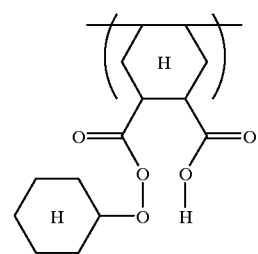
[I-a-25]
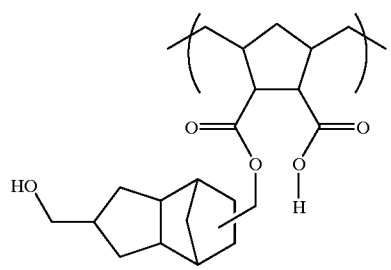
[I-a-26]
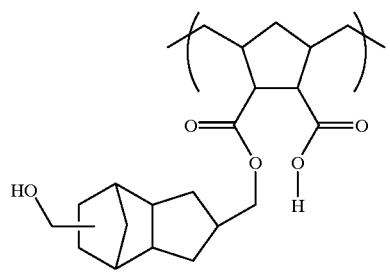
[I-a-27]
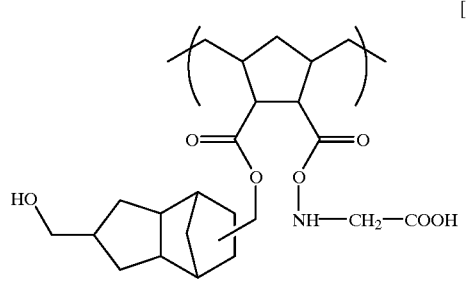

-continued
[I-a-28]
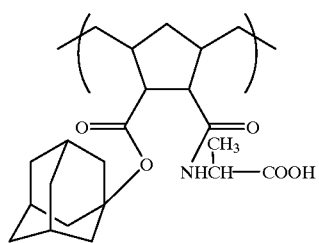
[I-a-29]
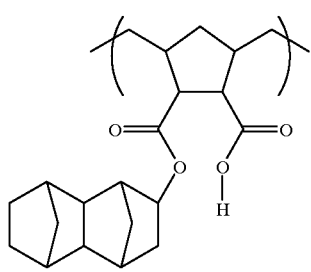
[I-a-30]
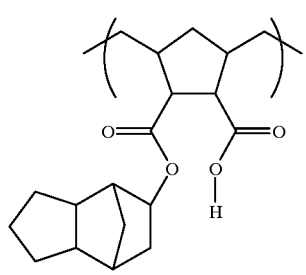
[I-a-31]
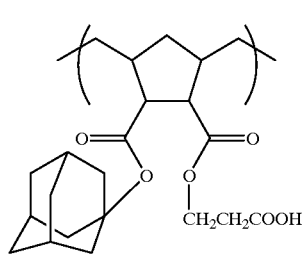
[I-a-32]
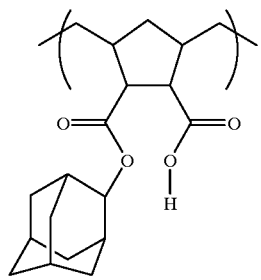
[I-a-33]
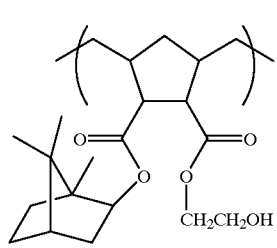
-continued
[I-a-34]
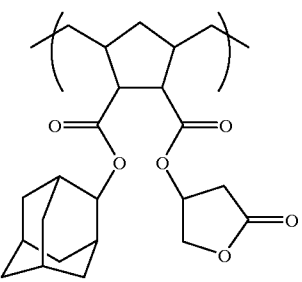
[I-a-35]
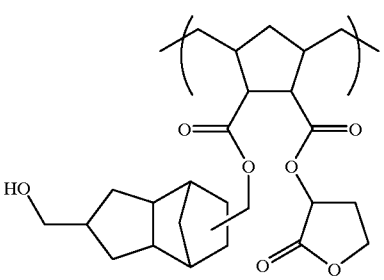
[I-a-36]
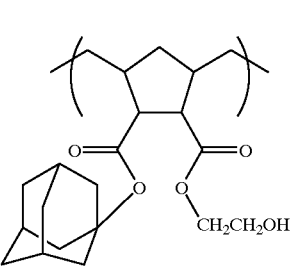
[I-a-37]
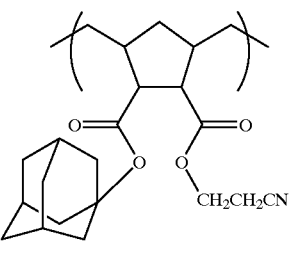
[I-a-38]
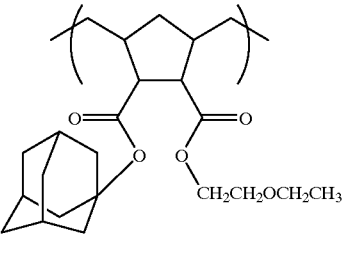

-continued
[I-a-39]
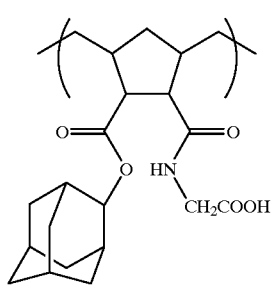
[I-a-40]
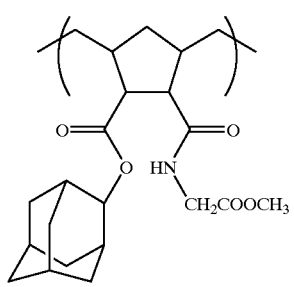
[II-a-1]
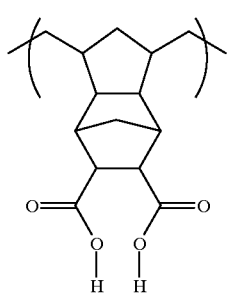
[II-a-2]
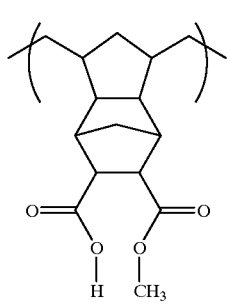
[II-a-3]
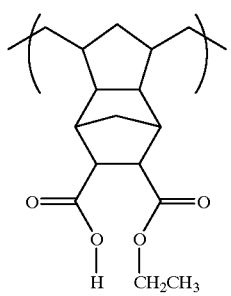
-continued
[II-a-4]
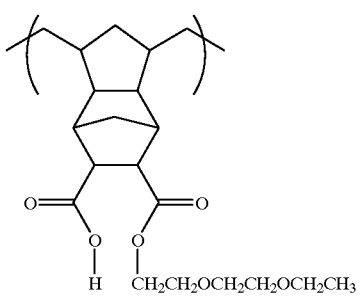
[II-a-5]
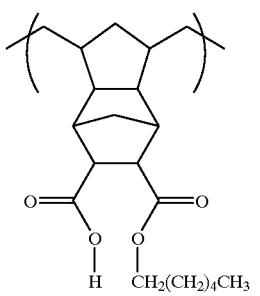
[II-a-6]
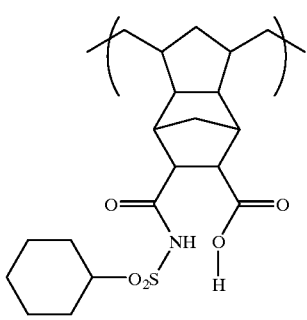
[II-a-7]
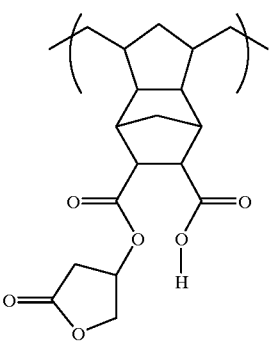

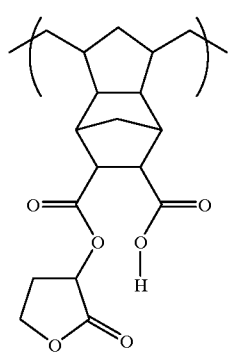
[II-a-8]
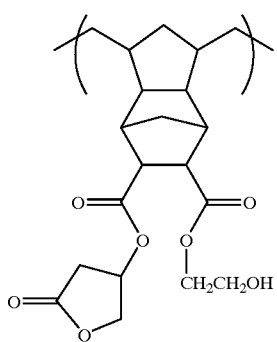
[II-a-9]
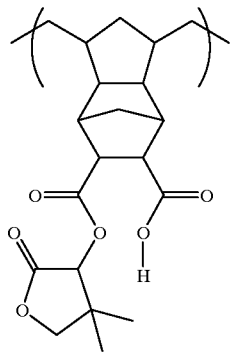
[II-a-10]
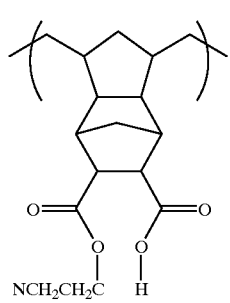
[II-a-11]
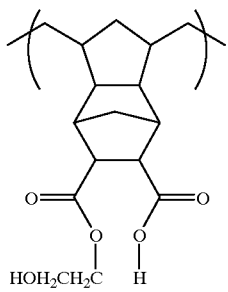
[II-a-12]
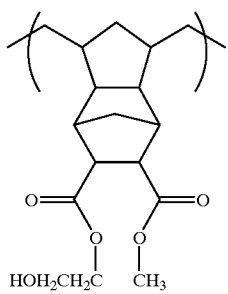
[II-a-13]
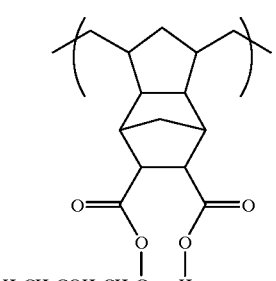
[II-a-14]
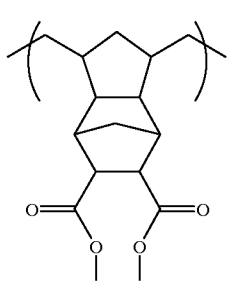
[II-a-15]
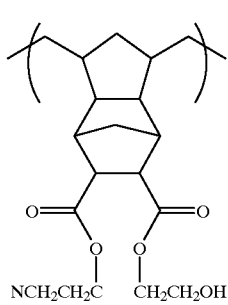
[II-a-16]

[II-a-17]
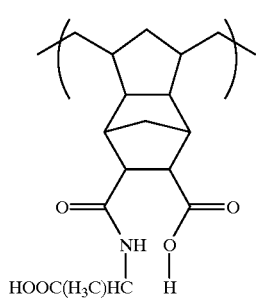
[II-a-18]
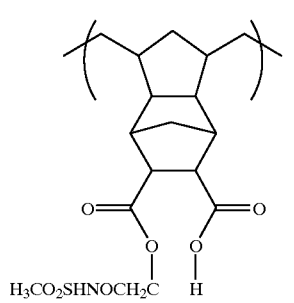
[II-a-19]
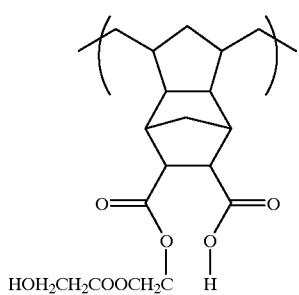
[II-a-20]
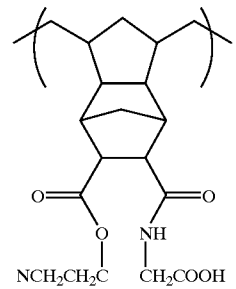
[II-a-21]
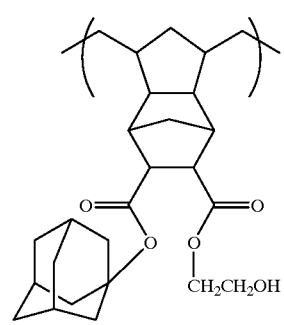
[II-a-22]
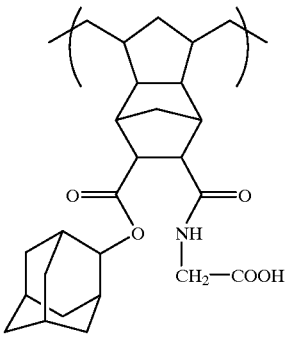
[II-a-23]
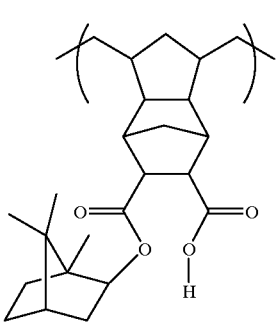
[II-a-24]
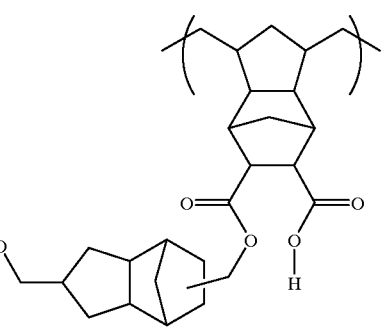
[II-a-25]
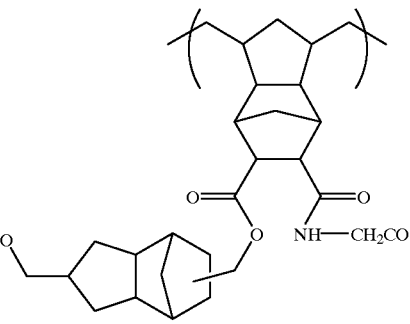

-continued
[II-a-26]
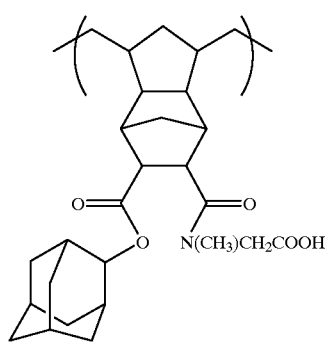
[II-a-27]
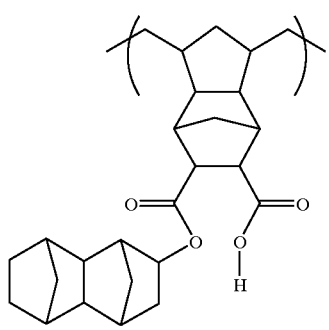
[II-a-28]
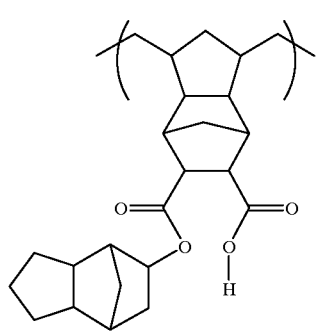
[II-a-29]
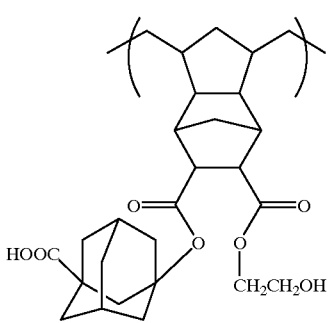
-continued
[II-a-30]
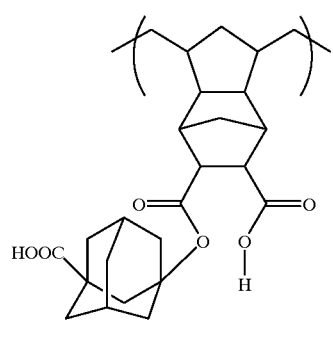
[II-a-31]
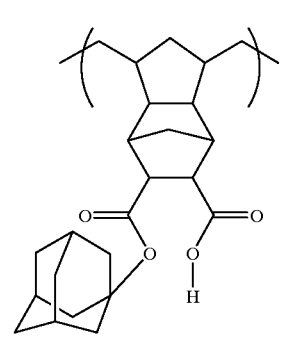
[II-a-32]
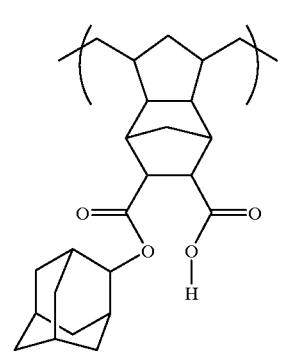
[II-a-33]
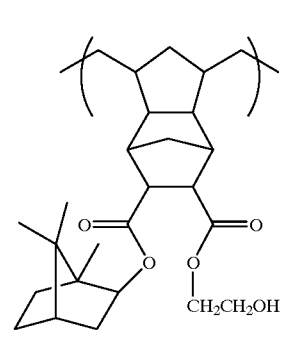

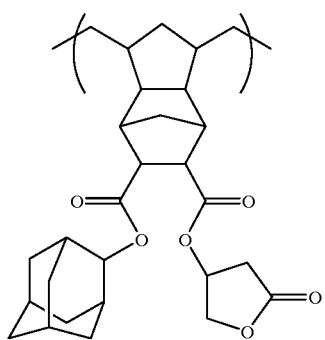
[II-a-34]
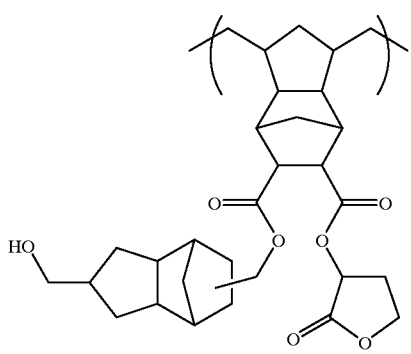
[II-a-35]
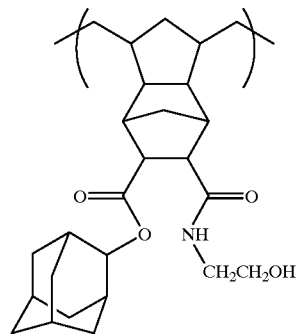
[II-a-36]
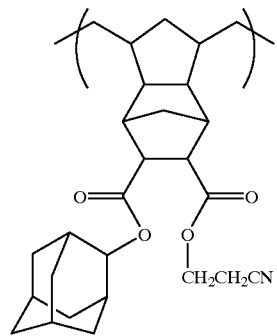
[II-a-37]
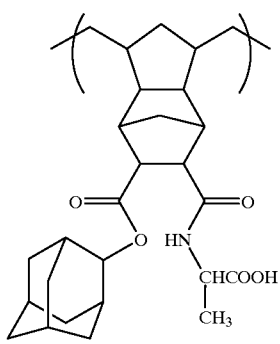
[II-a-38]
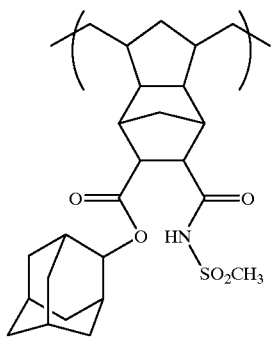
[II-a-39]
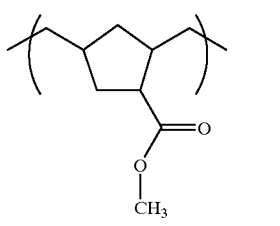
[II-a-40]
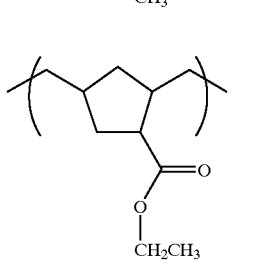
[III-a-1]
[III-a-2]

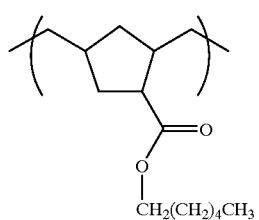
[III-a-3]
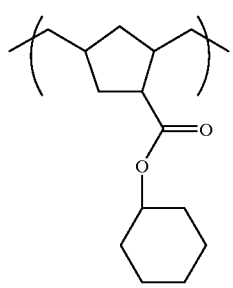
[III-a-4]
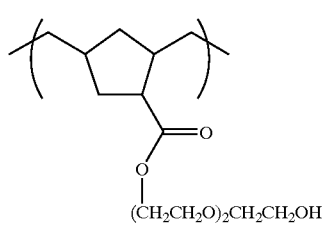
[III-a-5]
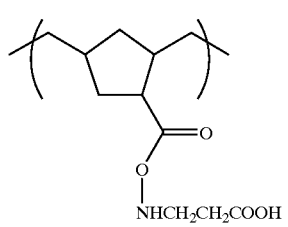
[III-a-6]
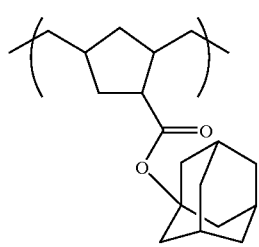
[III-a-7]
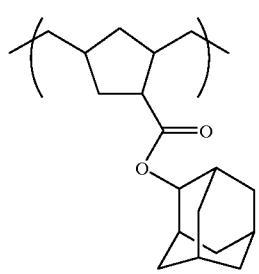
[III-a-8]
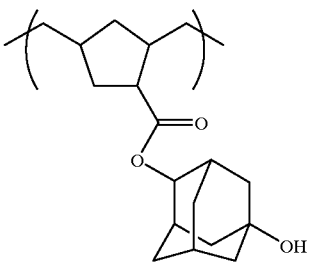
[III-a-9]
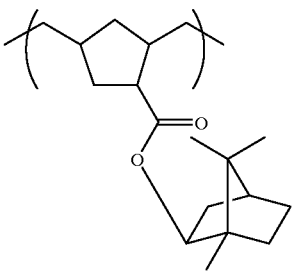
[III-a-10]
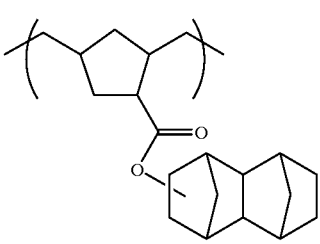
[III-a-11]
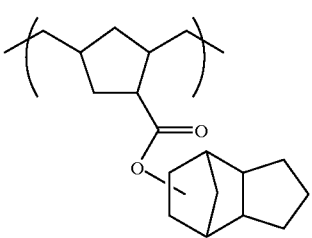
[III-a-12]
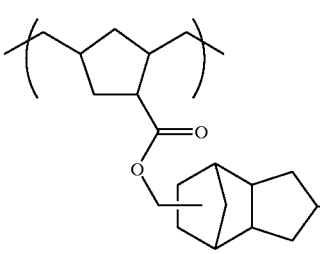
[III-a-13]
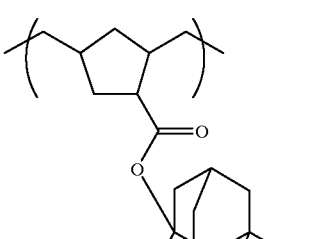
[III-a-14]

[III-a-15] 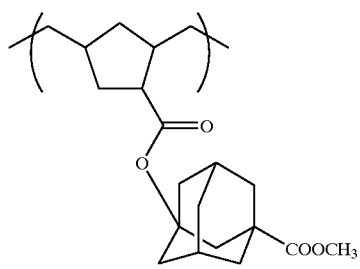
[III-a-16] 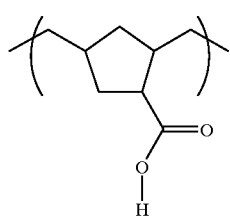
[III-a-17] 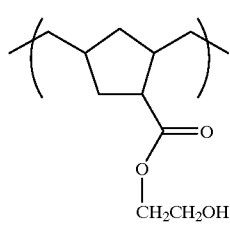
[III-a-18] 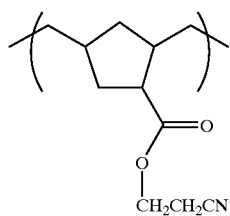
[III-a-19] 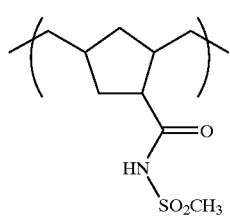
[III-a-20] 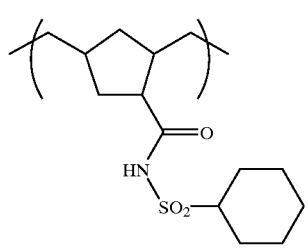
[III-a-21] 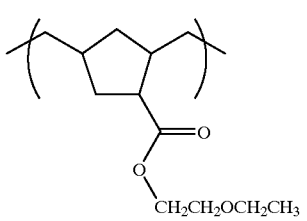
[III-a-22] 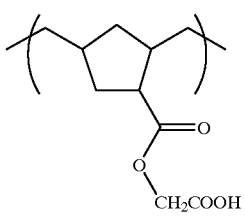
[III-a-23] 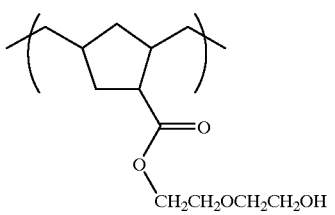
[III-a-24] 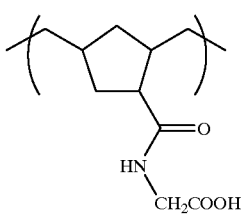
[III-a-25] 
[III-a-26] 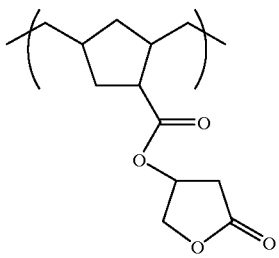

[III-a-27] 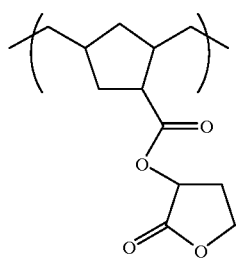
[III-a-28] 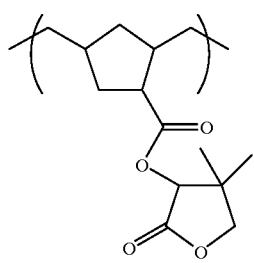
[III-a-29] 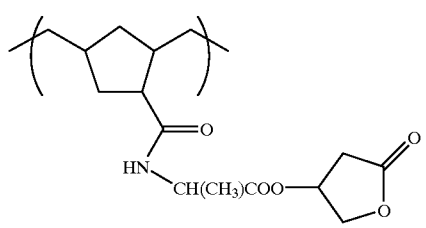
[III-a-30] 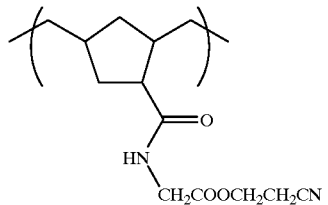
[III-a-31] 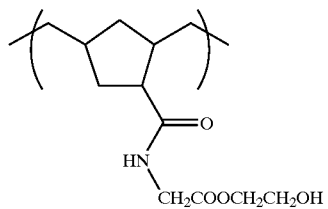
[III-a-32] 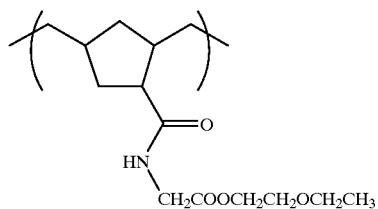
[IV-a-1] 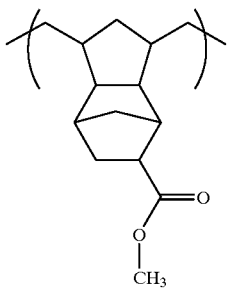
[IV-a-2] 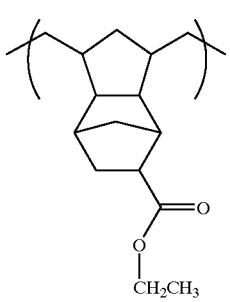
[IV-a-3] 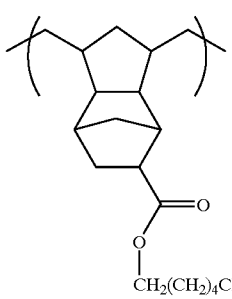
[IV-a-4] 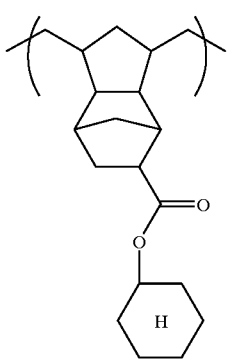
[IV-a-5] 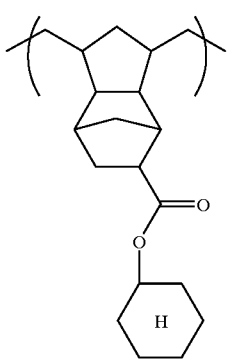

[IV-a-6]
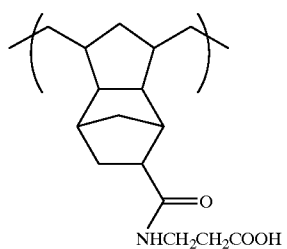
[IV-a-7]
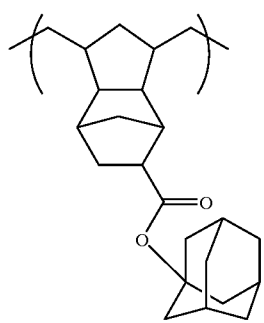
[IV-a-8]
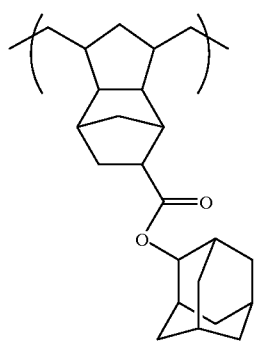
[IV-a-9]
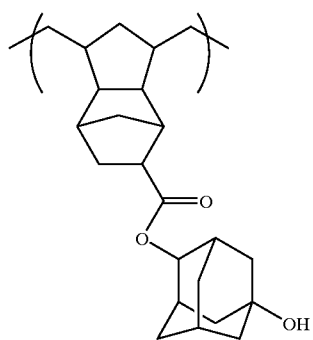
[IV-a-10]
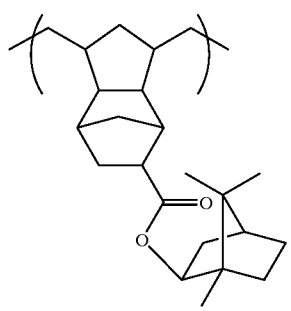
[IV-a-11]
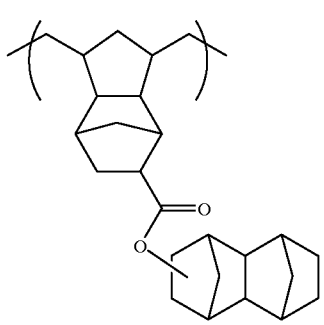
[IV-a-12]
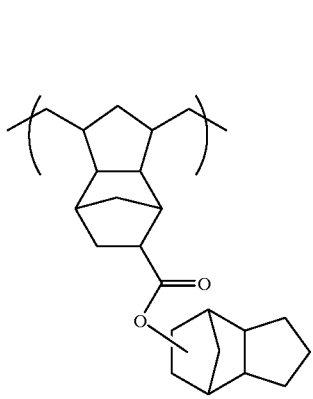
[IV-a-13]
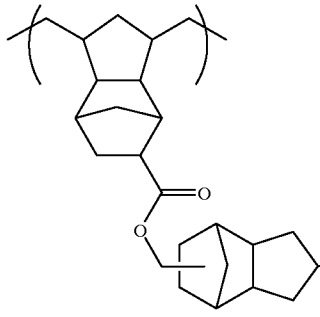
[IV-a-14]
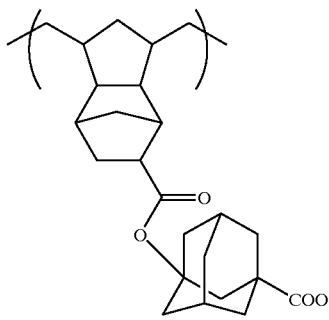

[IV-a-15]
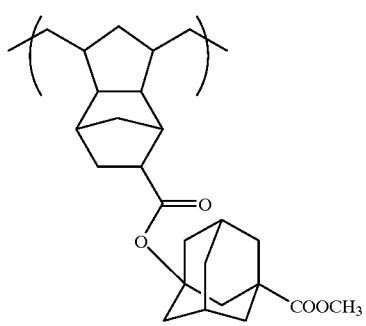
[IV-a-20]
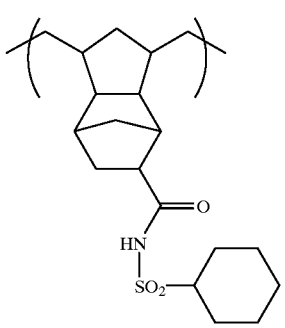
[IV-a-16]
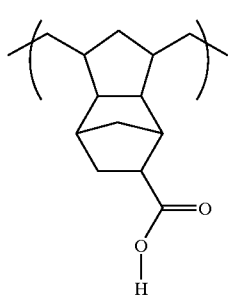
[IV-a-21]
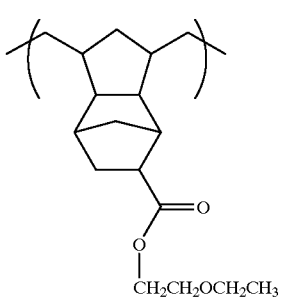
[IV-a-17]
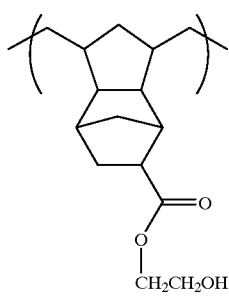
[IV-a-22]
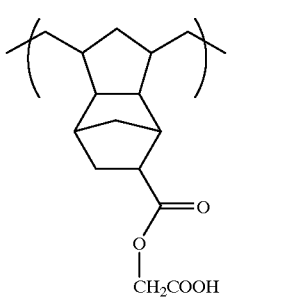
[IV-a-18]
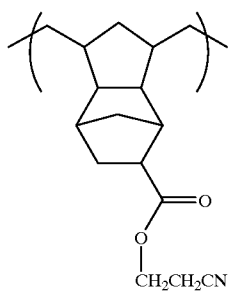
[IV-a-23]
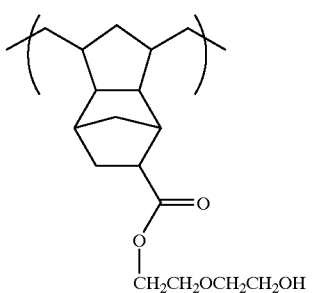
[IV-a-19]
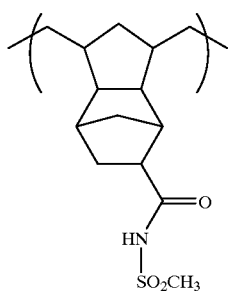
[IV-a-24]
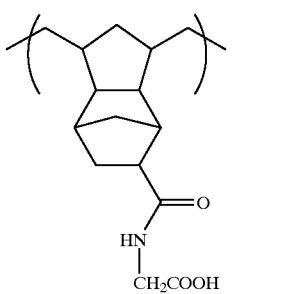

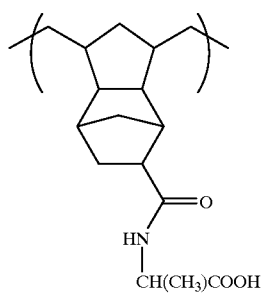
[IV-a-25]
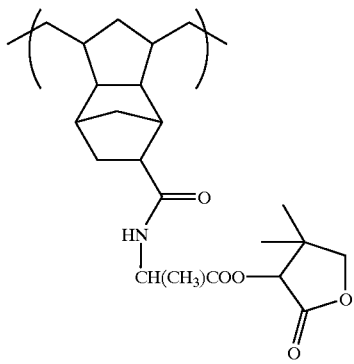
[IV-a-29]
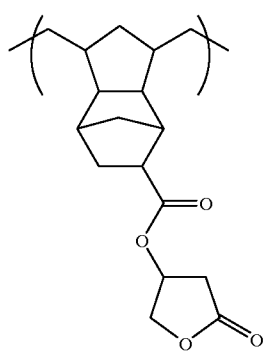
[IV-a-26]
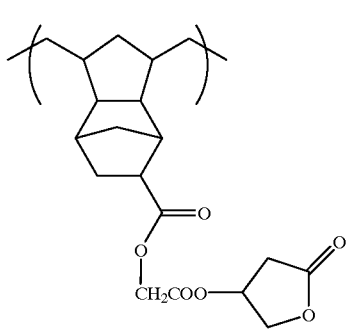
[IV-a-30]
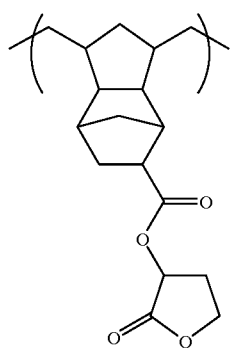
[IV-a-27]
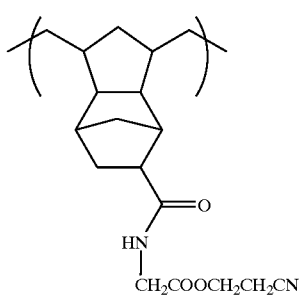
[IV-a-31]
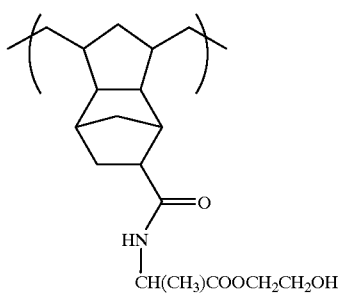
[IV-a-32]
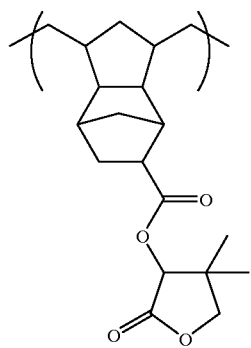
[IV-a-28]
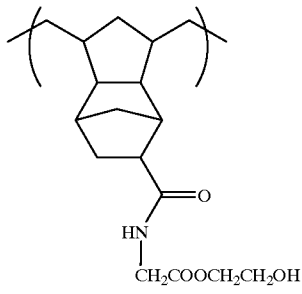
[IV-a-33]

[IV-a-34]
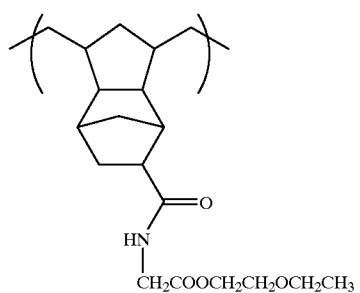
[V-1]
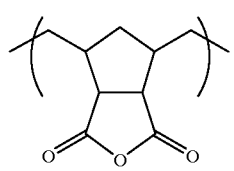
[V-2]
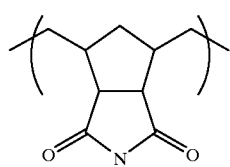
[V-3]
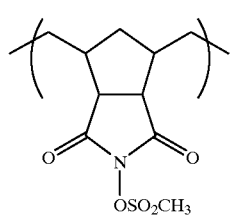
[V-4]
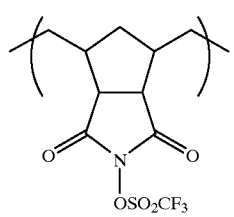
[V-5]
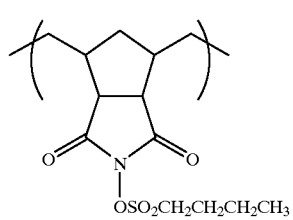
[V-6]
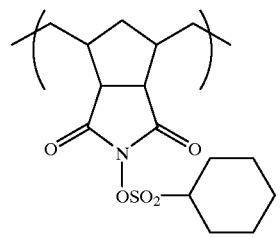
[V-7]
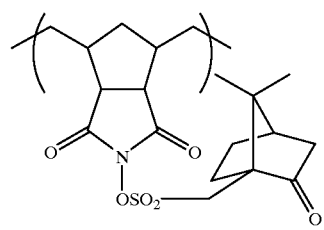
[V-8]
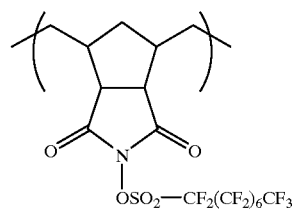
[VI-1]
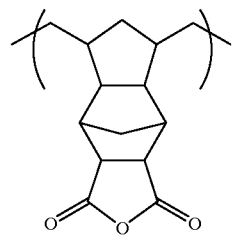
[VI-2]
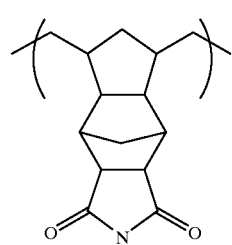
[VI-3]
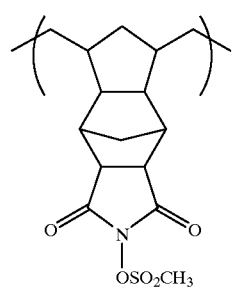

[VI-4] 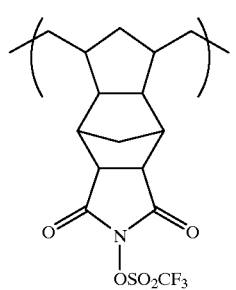
[VI-5] 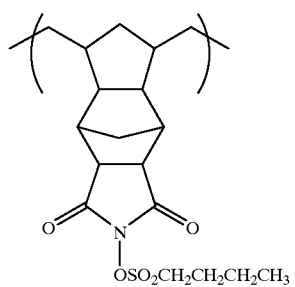
[VI-6] 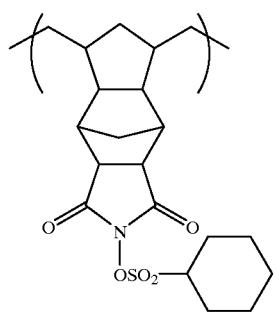
[VI-7] 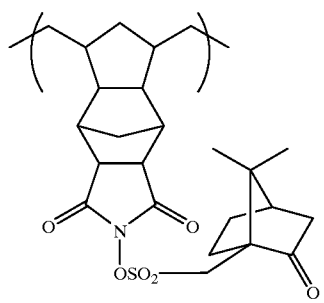
[VI-8] 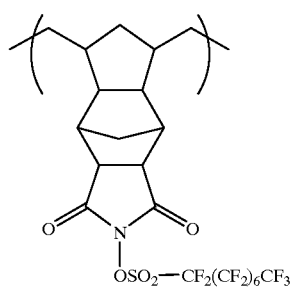
[I'-a-41] 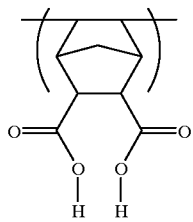
[I'-a-42] 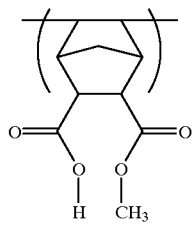
[I'-a-43] 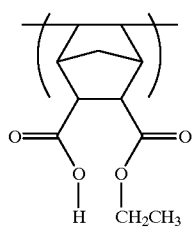
[I'-a-44] 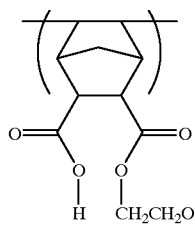
[I'-a-45] 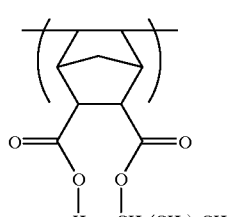
[I'-a-46]

[I'-a-47]
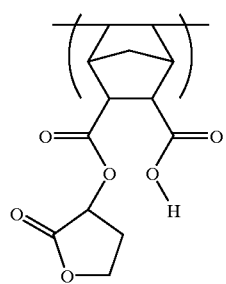
[I'-a-48]
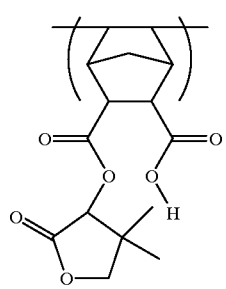
[I'-a-49]
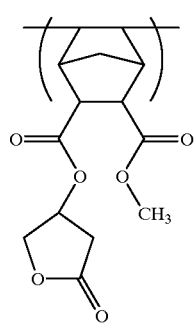
[I'-a-50]
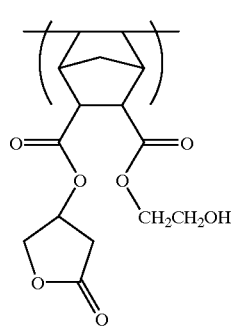
[I'-a-51]
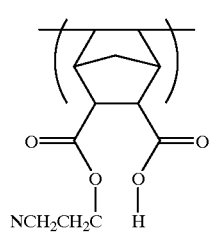
[I'-a-52]
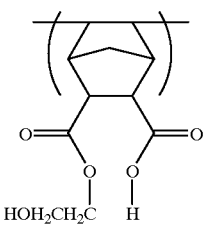
[I'-a-53]
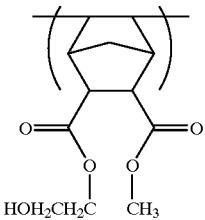
[I'-a-54]
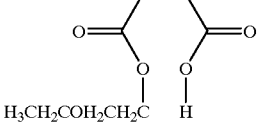
[I'-a-55]
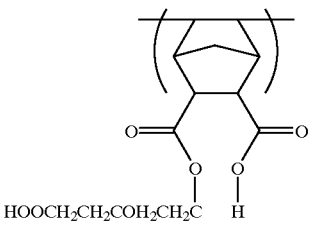
[I'-a-56]
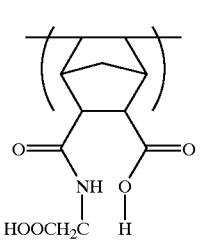
[I'-a-57]

[I'-a-58] 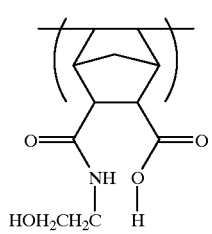
[I'-a-59] 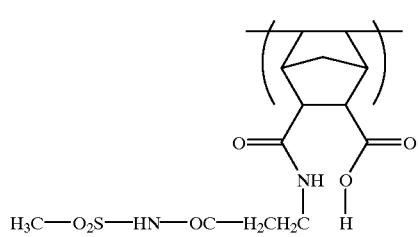
[I'-a-60] 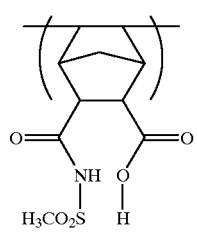
[I'-a-61] 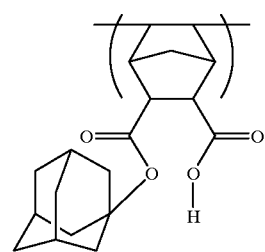
[I'-a-62] 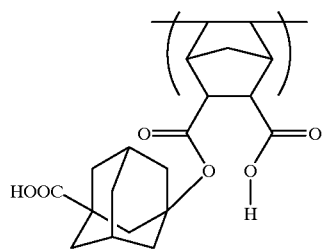
[I'-a-63] 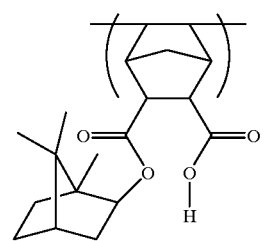
[I'-a-64] 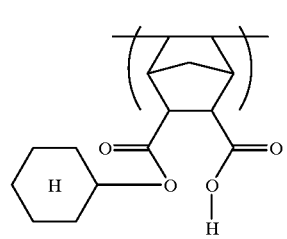
[I'-a-65] 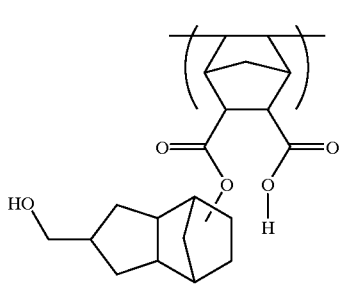
[I'-a-66] 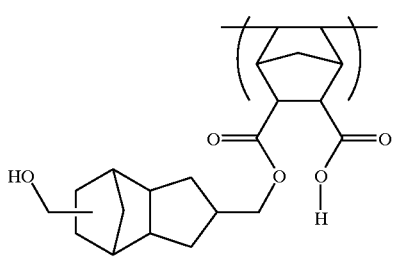
[I'-a-67] 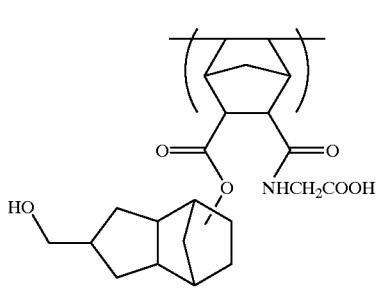
[I'-a-68] 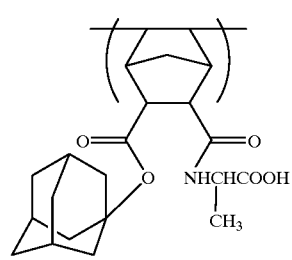

[I'-a-69]
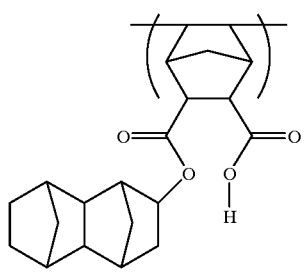
[I'-a-74]
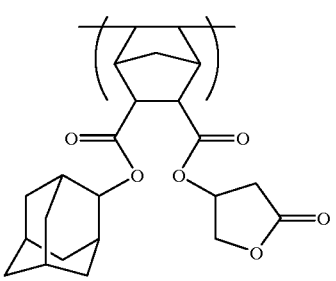
[I'-a-70]
[I'-a-75]
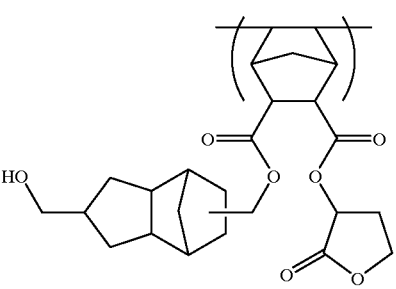
[I'-a-71]
[I'-a-76]
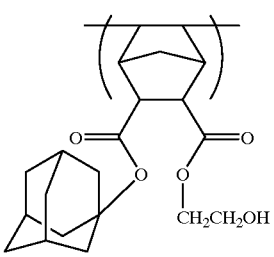
[I'-a-72]
[I'-a-77]
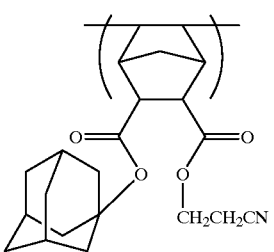
[I'-a-73]
[I'-a-78]
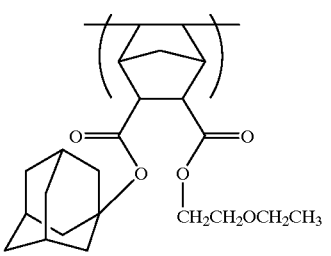

[I'-a-79]
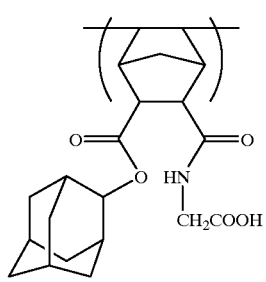
[I'-a-80]
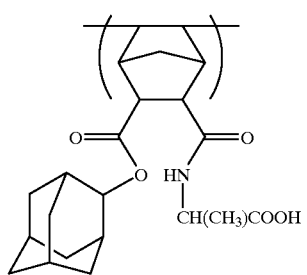
[II'-a-41]
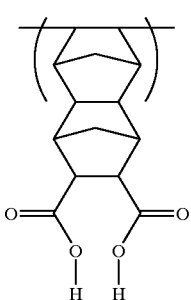
[II'-a-42]
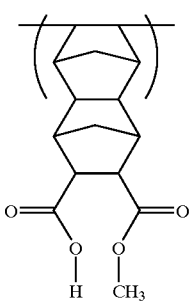
[II'-a-43]
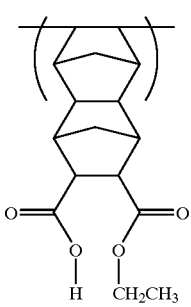
[II'-a-44]
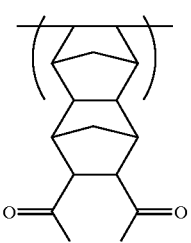
[II'-a-45]
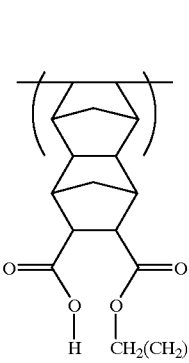
[II'-a-46]
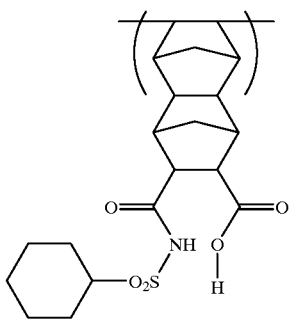
[II'-a-47]
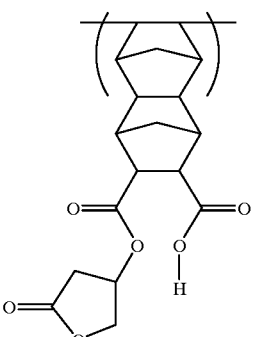

[II'-a-48]
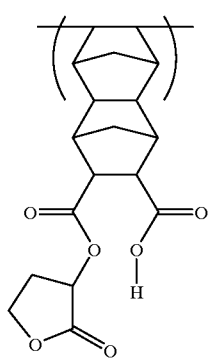
[II'-a-49]
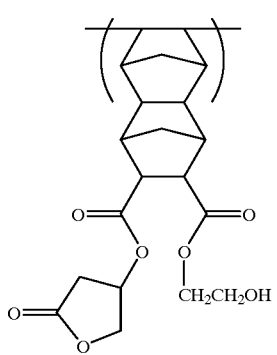
[II'-a-50]
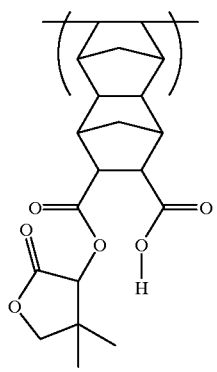
[II'-a-51]
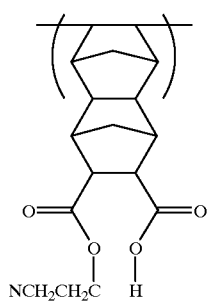
[II'-a-52]
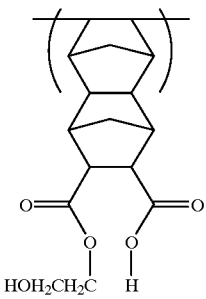
[II'-a-53]
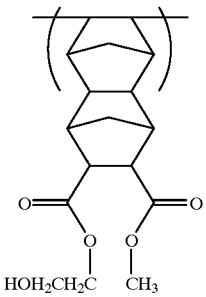
[II'-a-54]
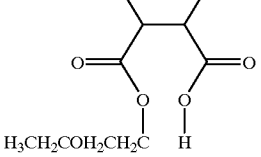
[II'-a-55]
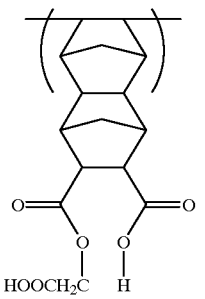
[II'-a-56]
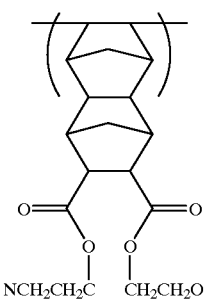

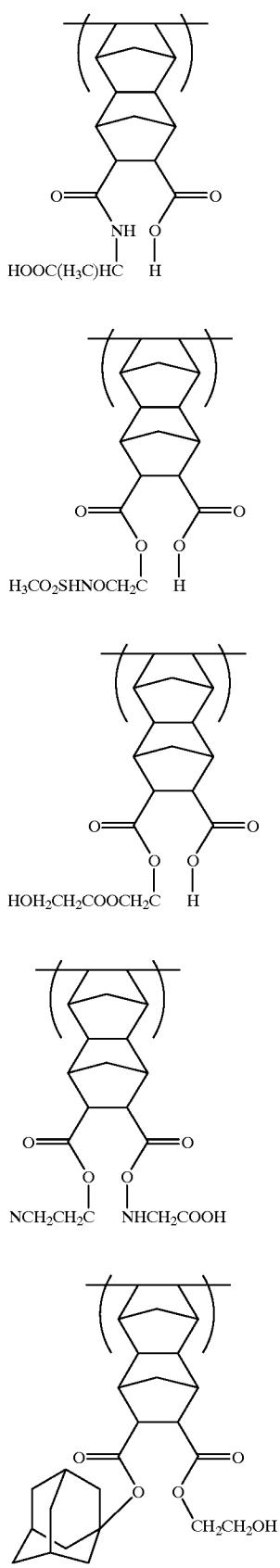
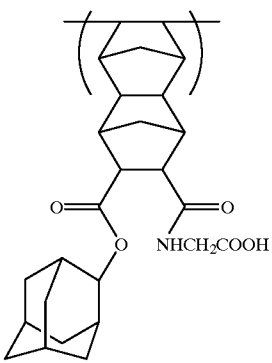
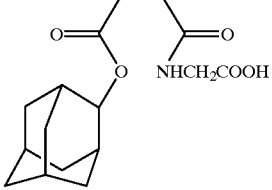
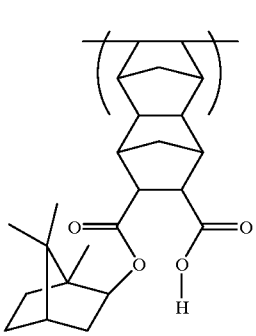
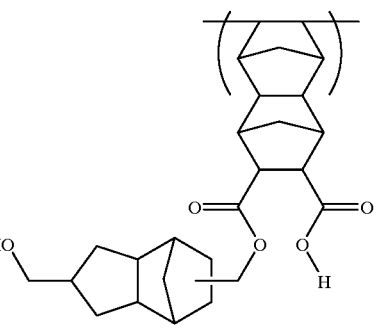
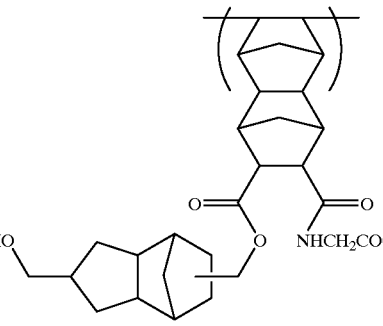
[II′-a-57]
[II′-a-58]
[II′-a-59]
[II′-a-60]
[II′-a-61]
[II′-a-62]
[II′-a-63]
[II′-a-64]
[II′-a-65]

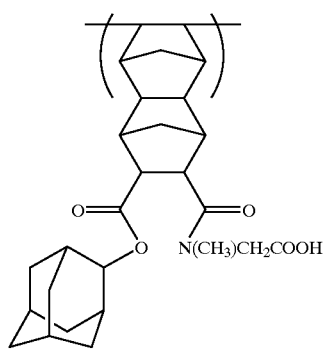
[II'-a-66]
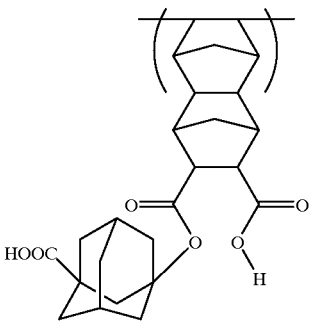
[II'-a-70]
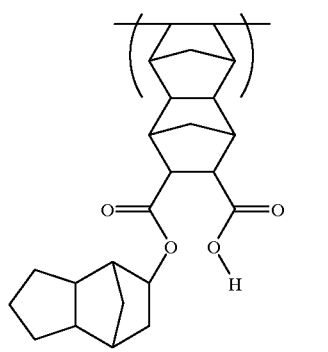
[II'-a-67]
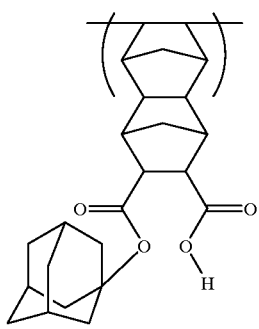
[II'-a-71]
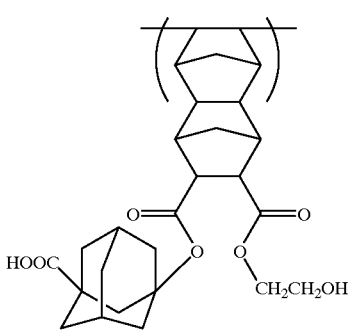
[II'-a-68]
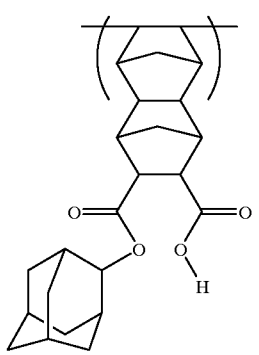
[II'-a-72]
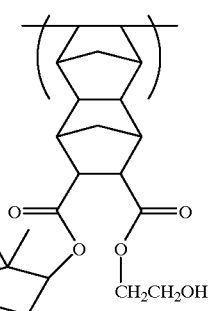
[II'-a-69]
[II'-a-73]

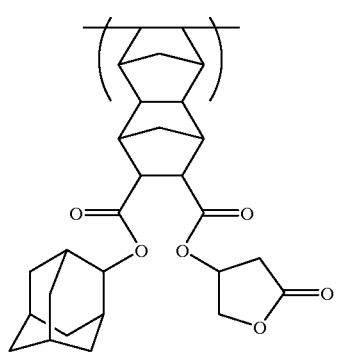
[II'-a-74]
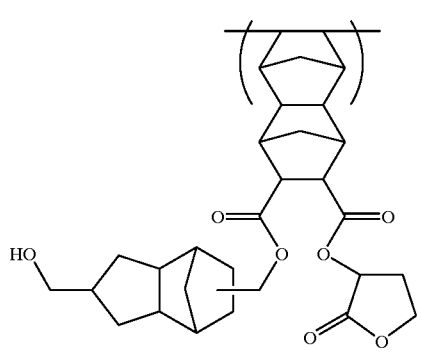
[II'-a-75]
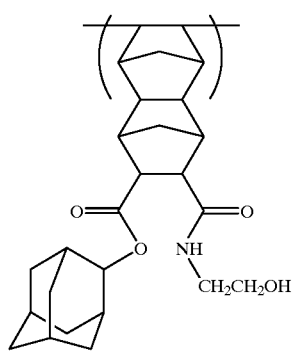
[II'-a-76]
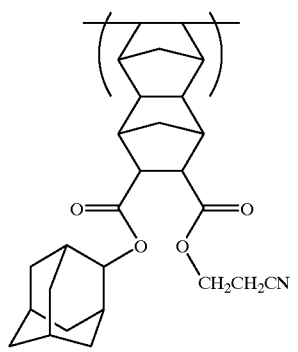
[II'-a-77]
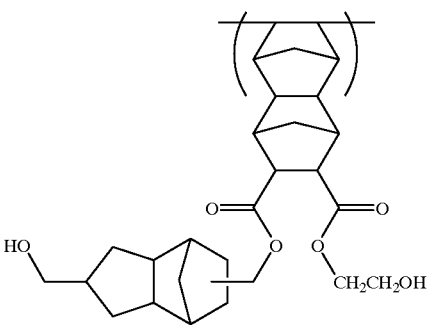
[II'-a-78]
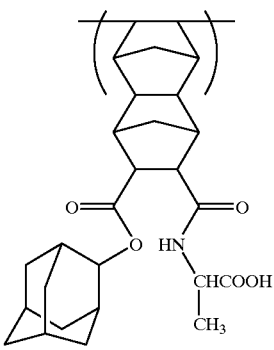
[II'-a-79]
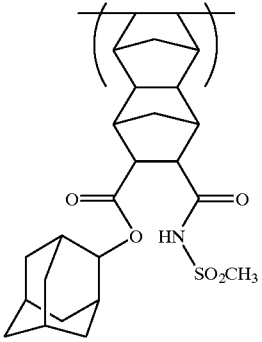
[II'-a-80]
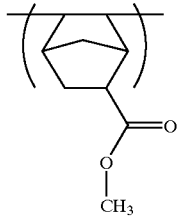
[III'-a-33]
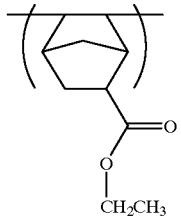
[III'-a-34]

[III'-a-35]
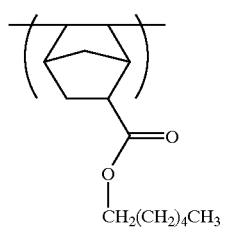
[III'-a-36]
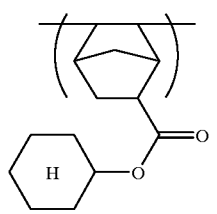
[III'-a-37]
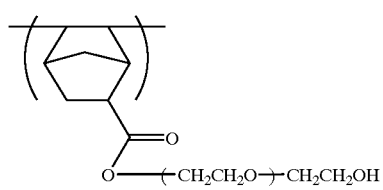
[III'-a-38]
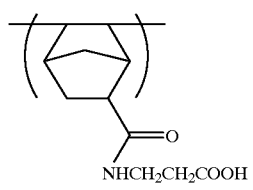
[III'-a-39]
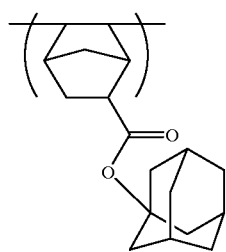
[III'-a-40]
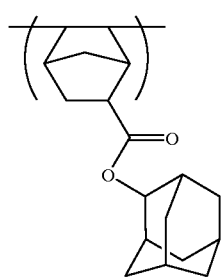
[III'-a-41]
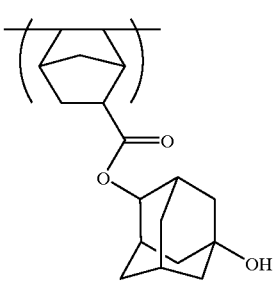
[III'-a-42]
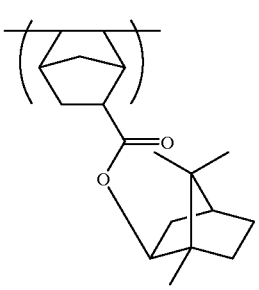
[III'-a-43]
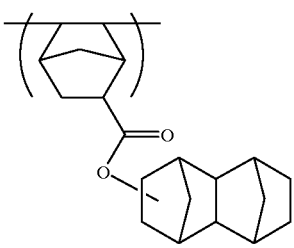
[III'-a-44]
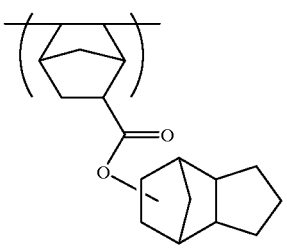
[III'-a-45]
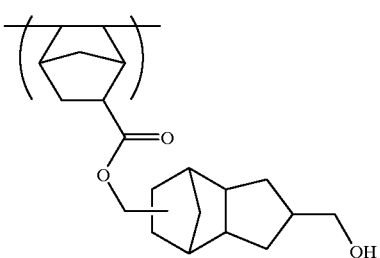

[III'-a-46]
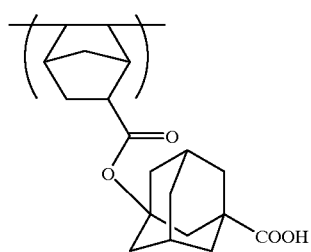
[III'-a-52]
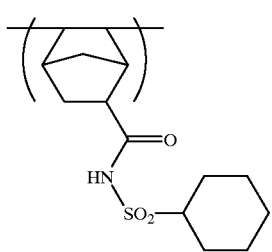
[III'-a-47]
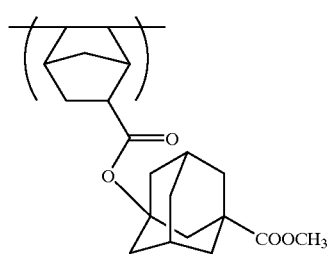
[III'-a-53]
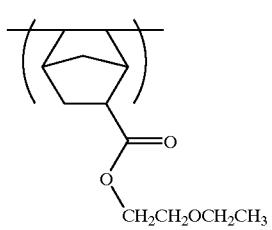
[III'-a-48]
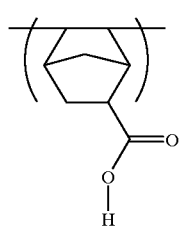
[III'-a-54]
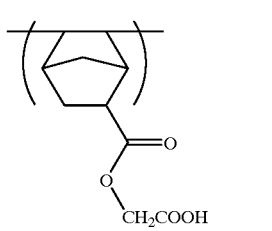
[III'-a-49]
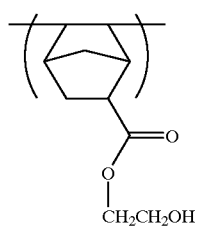
[III'-a-55]
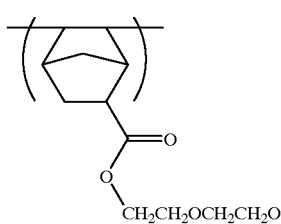
[III'-a-50]
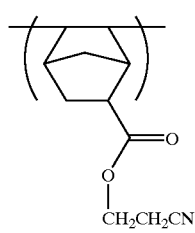
[III'-a-56]
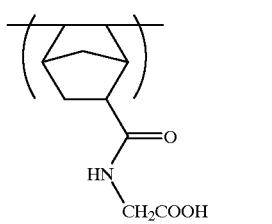
[III'-a-51]
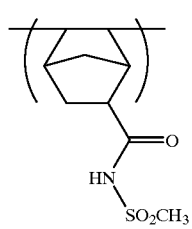
[III'-a-57]
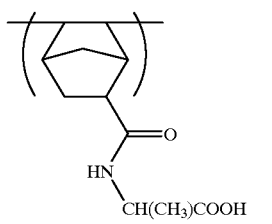

[III'-a-58]
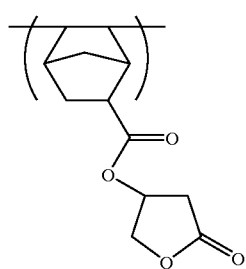
[III'-a-59]
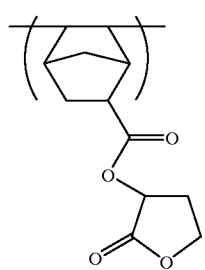
[III'-a-60]
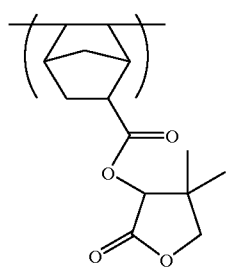
[III'-a-61]
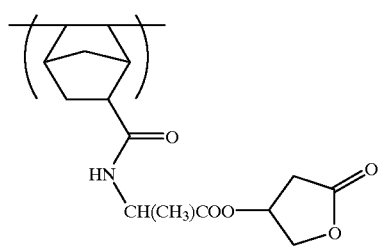
[III'-a-62]
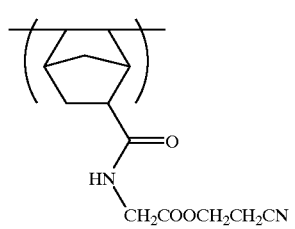
[III'-a-63]
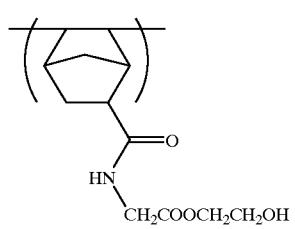
[III'-a-64]
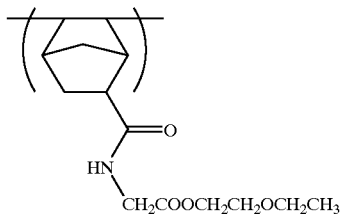
[IV'-a-35]
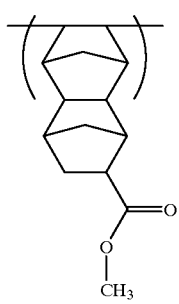
[IV'-a-36]
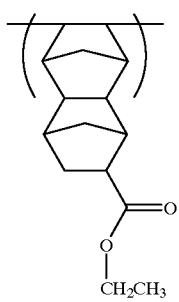
[IV'-a-37]
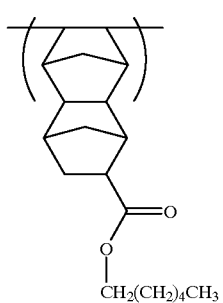
[IV'-a-38]
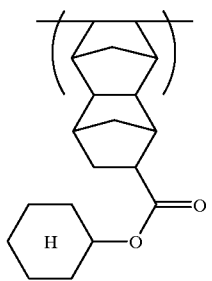

[IV'-a-39]
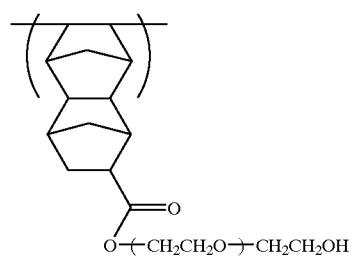
[IV'-a-40]
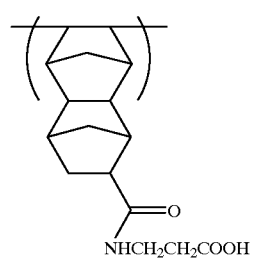
[IV'-a-41]
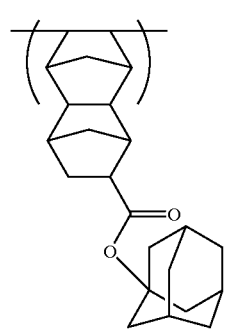
[IV'-a-42]
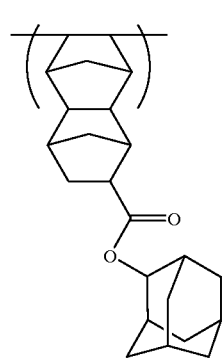
[IV'-a-43]
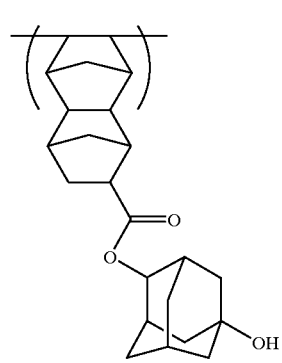
[IV'-a-44]
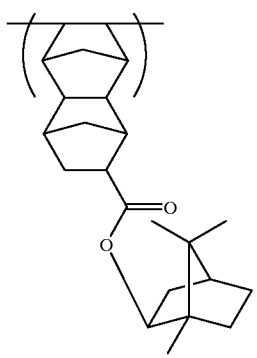
[IV'-a-45]
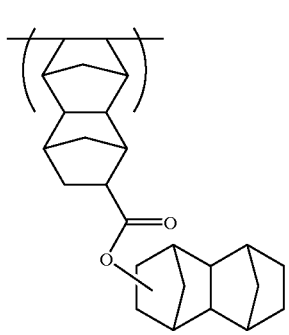
[IV'-a-46]
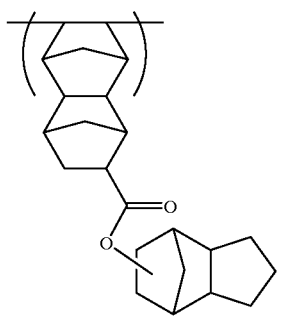
[IV'-a-47]
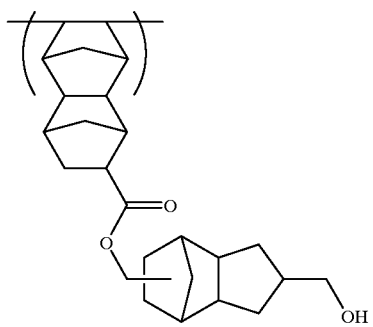

[IV'-a-48]
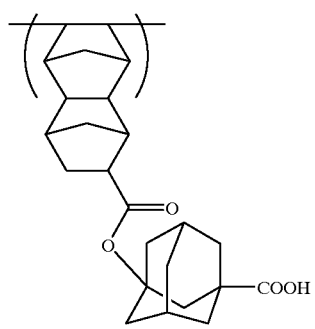
[IV'-a-49]
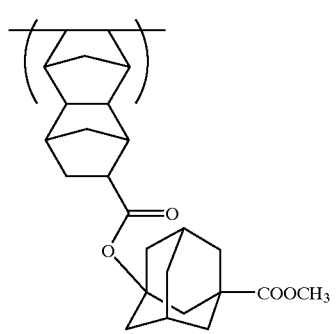
[IV'-a-50]
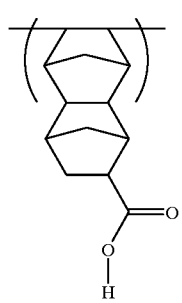
[IV'-a-51]
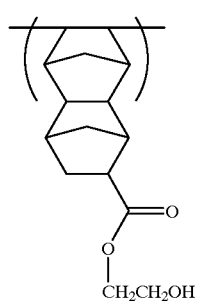
[IV'-a-52]
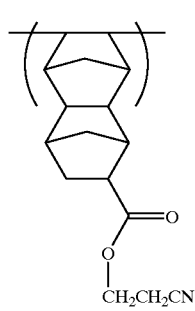
[IV'-a-53]
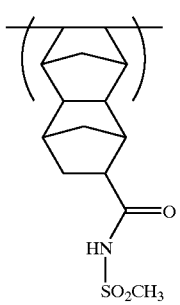
[IV'-a-54]
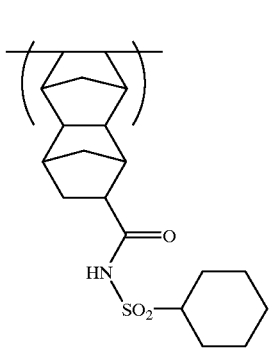
[IV'-a-55]
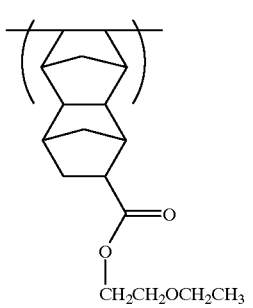
[IV'-a-56]
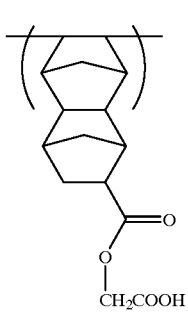
[IV'-a-57]
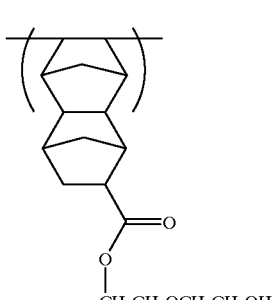

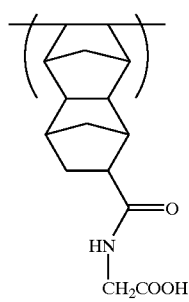
[IV'-a-58]
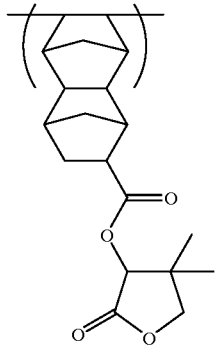
[IV'-a-62]
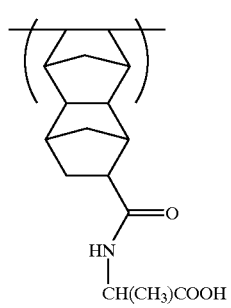
[IV'-a-59]
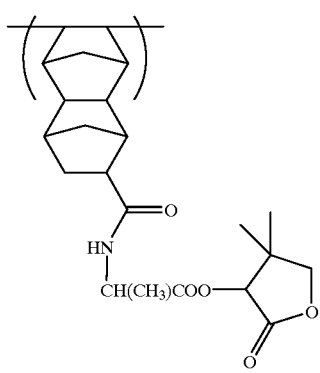
[IV'-a-63]
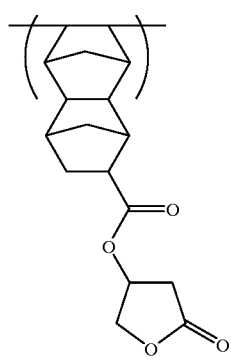
[IV'-a-60]
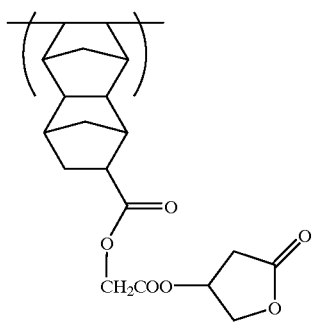
[IV'-a-64]
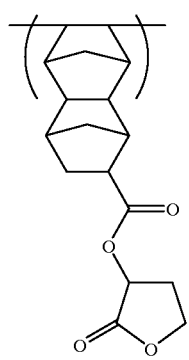
[IV'-a-61]
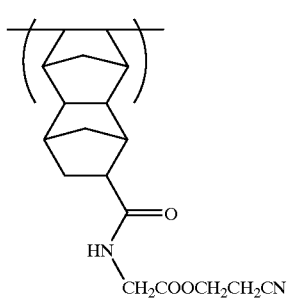
[IV'-a-65]

[IV'-a-66]
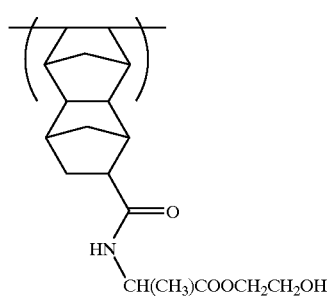
[IV'-a-67]
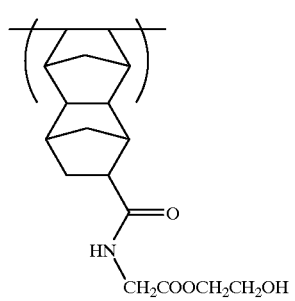
[IV'-a-68]
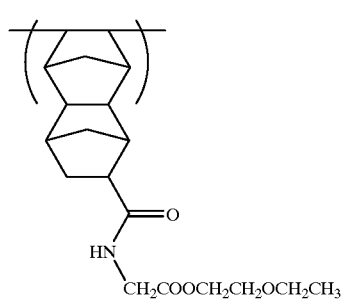
[V'-9]
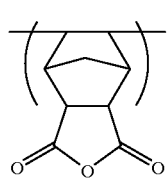
[V'-10]
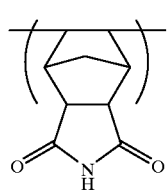
[V'-11]
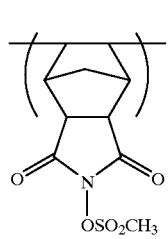
[V'-12]
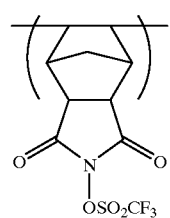
[V'-13]
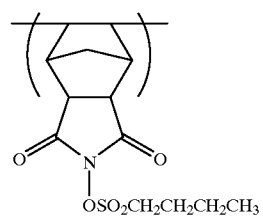
[V'-14]
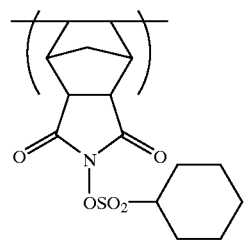
[V'-15]
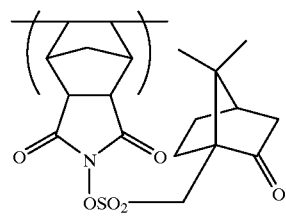
[V'-16]
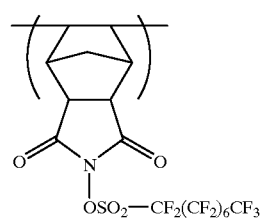
[VI'-9]
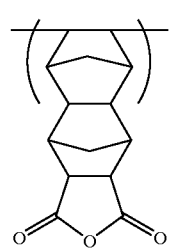

[VI'-10]

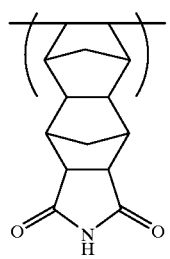

[VI'-11]

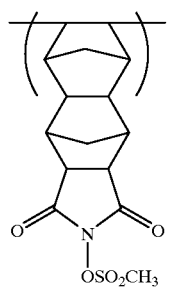

[VI'-12]

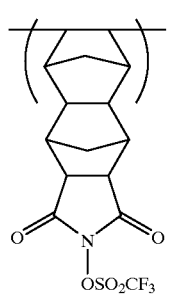

[VI'-13]

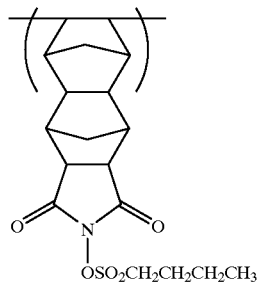

[VI'-14]

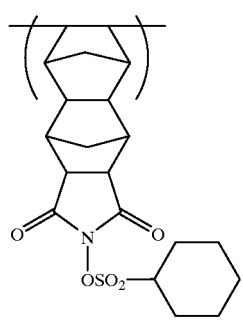

[VI'-15]

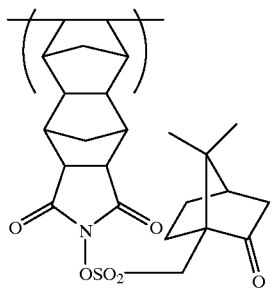

[VI'-16]

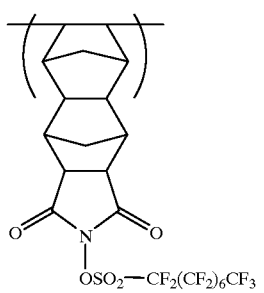

In producing the resins, the following monomers can be copolymerized as additional repeating units, within the range that the effect of the present invention is effectively obtained, but the monomers are not limited to those.

This makes it possible to finely control the properties required for the resin, particularly (1) solubility in a coating solvent, (2) film formability (glass transition temperature), (3) alkali developability, (4) reduction in film thickness (hydrophobicity, selection of alkali-soluble groups), (5) adhesiveness to a substrate in the unexposed area and (6) dry etching resistance.

Examples of such copolymerizable monomers include compounds having one addition polymerizable unsaturated bond, such as acrylates, methacrylates, acrylamides, methacrylamides, allyl compounds, vinyl ethers and vinyl esters. Specific examples of the compounds include:

acrylates, such as alkyl acrylates (preferably having 1 to 10 carbon atoms in the alkyl moiety), e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate);

methacrylates, such as alkyl methacrylates (preferably having 1 to 10 carbon atoms in the alkyl moiety), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate);

acrylamides, such as acrylamide, N-alkylacrylamides (the alkyl group having 1 to 10 carbon atoms, e.g., methyl, ethyl, propyl, butyl, t-butyl, heptyl, octyl, cyclohexyl, hydroxyethyl), N,N-dialkylacrylamides (the alkyl group having 1 to 10 carbon atoms, e.g., methyl, ethyl, butyl, isobutyl, ethylhexyl, cyclohexyl), N-hydroxyethyl-N-methylacrylamide, and N-2-acetamidoethyl-N-acetylacrylamide;

methacrylamides, such as methacrylamide, N-alkylmethacrylamides (the alkyl group having 1 to 10 carbon atoms, e.g., methyl, ethyl, t-butyl, ethylhexyl, hydroxyethyl, cyclohexyl), N,N-dialkylmethacrylamides (the alkyl group having 1 to 10 carbon atoms, e.g., ethyl, propyl, butyl), and N-hydroxyethyl-N-methylmethacrylamide;

allyl compounds, such as allyl esters (e.g., allyl acetate, allyl caproate, allyl caprate, allyl laurate, allyl palmitate, allyl stearate, allyl benzoate, allyl acetoacetate, allyl lactate) and allyl oxyethanol;

vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylamylethyl vinyl ether, diethylaminoethyl vinyl ether, butylaminoethyl vinyl ether, benzyl vinyl ether, tetrahydrofurfuryl vinyl ether);

vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

dialkyl itaconates, such as dimethyl itaconate, diethyl itaconate, and dibutyl itaconate;

dialkyl fumarates, such as dibutyl fumarate), or monoalkyl fumarates;

acrylic acid, methacrylic acid, crotonic acid, itaconic acid, maleic anhydride, maleimide, acrylonitrile, methacrylonitrile and maleylonitrile.

In addition to the above compounds, any of addition polymerizable unsaturate compounds may be used as comonomers so long as they can be copolymerized with the repeating units represented by the formula [I] or [II], or the repeating units represented by the formula [I'] or [II'].

The content of repeating units based on the above additional monomers in the resin is preferably 99 mol % or less, more preferably 90 mol % or less, and most preferably 80 mol % or less, to the total mole number of repeating units of the formulae [I] and [II], or the formulae [I'] and [II']. If the content exceeds 99 mole %, the effect of the present invention is not sufficiently exhibited, which is not preferable.

The resin according to the present invention preferably has a weight average molecular weight of 2,000 to 200,000. If the weight average molecular weight is lower than 2,000, deterioration in heat resistance and dry etching resistance appears, which is not so preferable. If the weight average molecular weight exceeds 200,000, developability deteriorates or viscosity of the resin is extremely increased, thereby film-formability deteriorates.

As described above, the resin according to the present invention has improved adhesiveness to a substrate and causes no development residue. Further, the resin does not substantially have, in both main and side chains, any groups showing strong absorption in the far ultraviolet region, so that the irradiation light reaches even the vicinity of the substrate surface of the coated film. This brings about excellent adhesiveness to a substrate, high sensitivity and excellent pattern profile. Low transmission density is a necessary requirement, and it is not directly bound up with excellent resist characteristics. Although it is needless to say that other factors affect, the resins according to the present invention satisfy such a necessary requirement.

The negative working photoresist composition according to the present invention mainly contains the above-described resin, a compound that generates an acid by irradiation with actinic rays or radiations, and a compound that lowers the solubility of alkali-soluble resins in a developer in the presence of the acid. The amount of the resin added in the composition is 40 to 95% by weight, preferably 50 to 90% by weight, based on the weight of the total solid content in the resist.

The compound capable of generating an acid upon irradiation with actinic rays or radiations (hereinafter sometimes referred to as a "photoacid generator"), which is used in the negative working photoresist composition, are explained below.

The photoacid generator is required to have two properties, namely (1) transparency to exposure light (provided that it has no photobleaching properties) and (2) sufficient photodecomposition property to secure resist sensitivity. It is the existing state that a guiding principle in molecular design for meeting these contradictory necessary requirements is still unclear, but the following examples can be listed.

Specifically, 2-oxocyclohexyl group-containing aliphatic alkylsulfonium salts and N-hydroxysuccinimidosulfonates as disclosed in JP-A-7-25846, JP-A-7-28237, JP-A-7-926757 and JP-A-8-27102 can be listed. Further, the description can be found, e.g., in *J. Photopolym. Sci. Technol.*, vol.7, No. 3, p. 423 (1994), and sulfonium salts represented by the following formula (VI), disulfones represented by the following formula (VII) and compounds represented by the following formula (VII) are cited as examples:

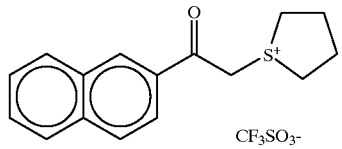

(VI)

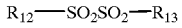

(VII)

(VIII)

In the above formulae, $R_{12}$ to $R_{15}$ are each an alkyl group or a cycloalkyl group, and they may be the same or different.

Furthermore, N-hydroxymaleinimidosulfonates of the following formula (IX) are also suitable for the photoacid generators

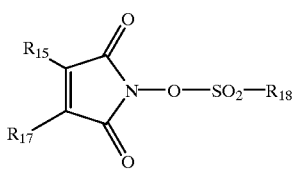

(IX)

In the above formula, $R_{16}$ and $R_{17}$, which may be the same or different, each represent a hydrogen atom, an alkyl group having 1 to 6 carbon atoms or a cycloalkyl group, or $R_{16}$ and $R_{17}$ may combine each other via an alkylene group to form a ring; and $R_{18}$ represents an alkyl group, a perfluoroalkyl group, a cycloalkyl group or a camphor-substituted. These N-hydroxymaleinimidosulfonates are especially advantageous in the point of photosensitivity.

Examples of the alkyl group having 1 to 6 carbon atoms as $R_{16}$ or $R_{17}$ in the above formula (IX) include methyl, ethyl, propyl, isopropyl, n-butyl, isobutyl, tert-butyl, n-pentyl and n-hexyl groups. Of these groups, methyl, ethyl and propyl groups are preferable, and methyl and ethyl groups are particularly preferable. Examples of the cycloalkyl group include a cyclopropyl, cyclopentyl and cyclohexyl groups. Of these groups, cyclopentyl and cyclohexyl groups are preferable. Examples of the group formed by combining $R_{16}$ with $R_{17}$ via an alkylene chain include cyclohexyl, norbornyl and tricyclodecanyl groups.

Examples of the alkyl group as $R_{18}$ include straight-chain alkyl groups having 1 to 20 carbon atoms, such as methyl, ethyl and propyl groups, and branched alkyl groups having 3 to 20 carbon atoms, such as isopropyl, isobutyl, tert-butyl and neopentyl groups. Of those alkyl groups, straight-chain or branched alkyl groups having 16 or less carbon atoms, and preferably 4 to 15 carbon atoms, are preferred. Examples of the perfluoroalkyl group as $R_{18}$ include straight-chain perfluoroalkyl groups having 1 to 20 carbon atoms, such as trifluoromethyl and pentafluoroethyl groups, and branched perfluoroalkyl groups having 3 to 20 carbon atoms, such as heptafluoroisopropyl and nonafluoro-tert-butyl groups. Of those perfluoroalkyl groups, straight-chain or branched perfluoroalkyl groups having 16 or less carbon atoms are preferred. Examples of the cycloalkyl group include monocyclic cycloalkyl groups, such as cyclopentyl and cyclohexyl groups, and polycyclic cycloalkyl groups, such as decalyl, norbornyl and tricyclodecanyl groups.

The suitable proportion of such a photoacid generator in the present negative working photoresist composition is from 0.1 to 20% by weight, preferably from 0.5 to 15% by weight, and more preferably from 1 to 10% by weight, based on the weight of the total solid content in the composition.

In the present negative working photoresist compositions, the following photoacid generators may further be used in combination with the above-recited ones.

The proportion of a photoacid generator used in combination with the above-recited ones in the present negative working resist composition is 2% by weight, and preferably 1% by weight, based on the weight of the total solid content in the composition.

Examples of a photoacid generator usable in combination with those recited above include the diazonium salts described, e.g., in S. I. Schlesinger, *Photogr. Sci. Eng.*, 18, 387 (1974), and T. S. Bal et al., *Polymer*, 21, 423 (1980); onium salts, such as the ammonium salts described, e.g., in U.S. Pat. Nos. 4,069,055, 4,069,056 and Re 27,992, and Japanese Patent Application No. 3-140140, the phosphonium salts described, e.g., in D. C. Necker et al., *Macromolecules*, 17, 2468 (1984), C. S. Wen et al., *Teh. Proc. Conf. Rad. Curing ASIA*, p. 478, Tokyo (Oct., 1988), and U.S. Pat. Nos. 4,069,055 and 4,069,056, the iodonium salts described, e.g., in J. V. Crivello et al., *Macromolecules*, 10(6), 1307 (1977), *Chem. & Eng. News*, Nov. 28, p. 31 (1988), European Patent 104,143, U.S. Pat. Nos. 339,049 and 410,210, JP-A-2-150848 and JP-A-2-296514, the sulfonium salts described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents 370,693, 3,902,114, 233,567, 297,443 and 297,442, U.S. Pat. Nos. 4,933,377, 161,811, 410,201, 339,049, 4,760,013, 4,734,444 and 2,883,827, and German Patents 2,904,626, 3,604,580 and 3,604,581, the selenonium salts described, e.g., in J. V. Crivello et al., *Macromolecules*, 10(6), 1307 (1977), and J. V. Crivello et al., *J. Polymer Sci.*, Polymer Chem. Ed., 17, 1047 (1979), and the arsonium salts described, e.g., in C. S. Wen et al., *Teh. Proc. Conf. Rad. Curing ASIA*, p. 478, Tokyo (Oct., 1988); the organic halogeno-compounds described, e.g., in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., *J. Rad. Curing*, 13(4), 26 (1986), T. P. Gill et al., *Inorg. Chem.*, 19, 3007 (1980), D. Astruc, *Acc.Chem. Res.*, 19(12), 377 (1896), and JP-A-2-161445; the photoacid generators having o-nitrobenzyl type protective groups described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B.Amit et al., *Tetrahedron Lett.*, (24) 2205 (1973), D. H. R. Barton et al., *J. Chem. Soc.*, 3571 (1965), P. M. Collins et al., *J. Chem. SoC.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J.Electrochem. Soc.*, Solid State Sci. Technol., 130(6), F. M. Houlihan et al., *Macromolecules*, 21, 2001 (1988), European Patents 0,290,750, 0,046,083, 0,156, 535, 0,271,851 and 0,388,343, U.S. Pat. Nos. 3,901,710 and 4,181,531, JP-A-60-198538 and JP-A-53-133022; the compounds generating a sulfonic acid on photolysis, which are represented by iminosulfonates, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 0,199,672, 0,084,515, 0,044,115 and 0,101,122, U.S. Pat. Nos. 4,618, 564, 4,371,605 and 4,431,774, JP-A-64-18143, JP-A-2-245756 and Japanese Patent Application No. 3-140109: and the disulfone compounds described, e.g., in JP-A-61-166544.

Besides the photoacid generators as recited above, the polymers in the main or side chains of which the above-recited groups or compounds that can generate acids upon exposure are introduced, such as the polymers disclosed, e.g., in M. E. Woodhouse et al., *J. Am. Chem. Soc.*, 104, 5586(1982), S. P. Pappas et al., *J. Imaging Sci.*, 30(5), 218(1986), S. Kondo et al., *Makromol. Chem.,* Rapid Commun., 9, 625(1988), Y. Yamada et al., *Makromol. Chem.,* 152, 153, 168(1972), J. V. Crivello et al., *J. Polymer Sci.,* Polymer Chem. Ed., 17, 3845(1979), German Patent 3,914,407. JP-A-63-26653, JP-A-55-164834, JP-A-62-69263, JP-A-63-146038, JP-A-63-163452, JP-A-62-153853 and JP-A-63-146029, can be used.

In addition, the compounds capable of generating acids upon exposure as disclosed, e.g., in V. N. R. Pillai, *Synthesis,* (1), 1(1980), A.Abad et al., *Tetrahedron Lett.,* (47) 4555 (1971), D. H. R. Barton et al., *J. Chem. Soc.,* (C), 329(1970), U.S. Pat. No. 3,779,778 and European Patent 126,712, can also be used.

Of the above-recited compounds for the combined use, which can be decomposed by irradiation with actinic rays or radiations to generate acids, the compounds that are particularly advantageously used are shown below:

(1) Trihalomethyl-substituted oxazole compounds represented by the following formula (PAG1), or trihalomethyl-substituted s-triazine compounds represented by the following formula (PAG2):

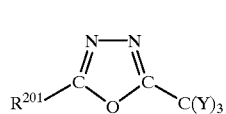

(PAG1)

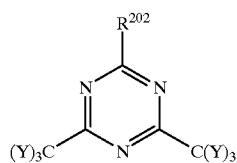

(PAG2)

wherein $R^{201}$ is a substituted or unsubstituted aryl or alkenyl group; $R^{202}$ is a substituted or unsubstituted aryl, alkenyl or alkyl group, or $-C(Y)_3$; and Y is a chlorine or bromine atom.

Examples of such compounds are shown below, but the present invention is not limited to those examples.

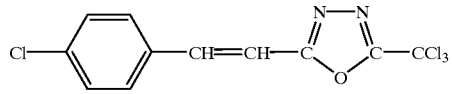

(PAG1-1)

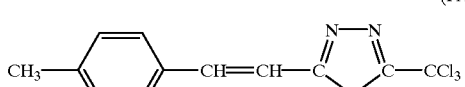

(PAG1-2)

(PAG1-3)

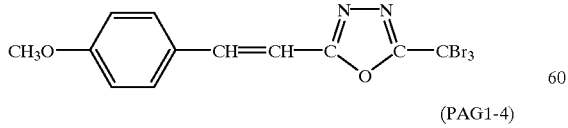

(PAG1-4)

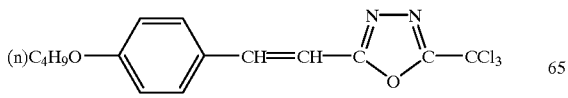

(PAG1-5)

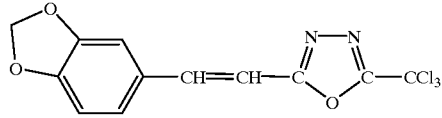

(PAG1-6)

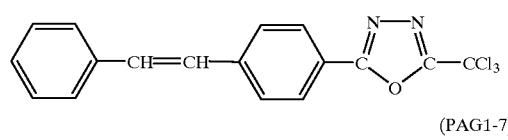

(PAG1-7)

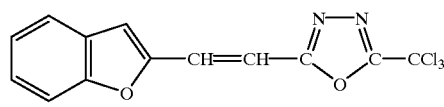

(PAG1-8)

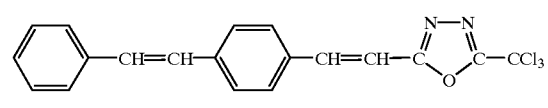

(PAG2-1)

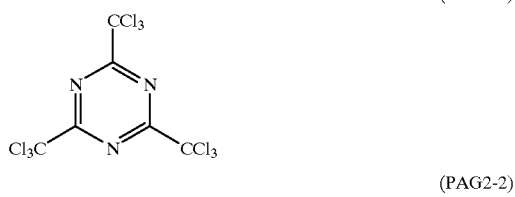

(PAG2-2)

(PAG2-3)

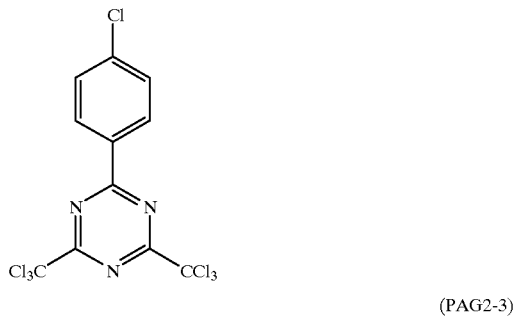

(PAG2-4)

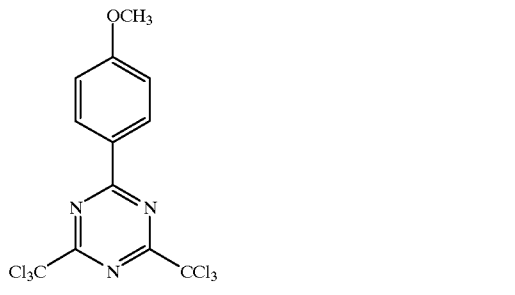

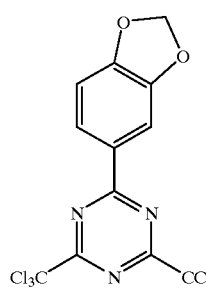

-continued (PAG2-5)
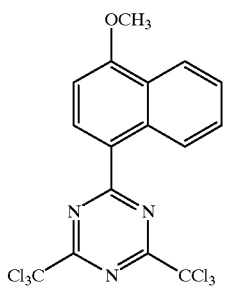

(PAG2-6)
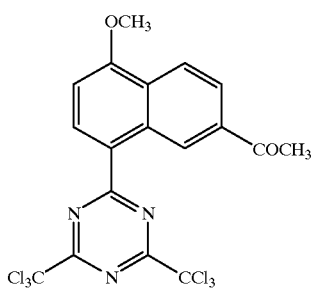

(PAG2-7)
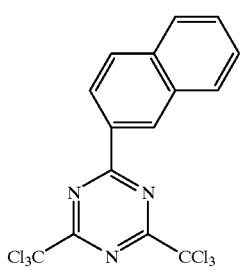

(PAG2-8)
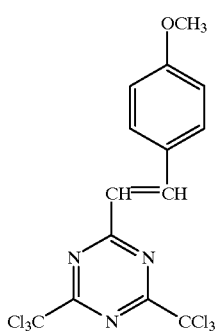

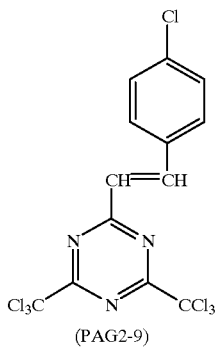
(PAG2-9)   (PAG2-10)

(2) Iodonium salts represented by the following formula (PAG3), or sulfonium salts represented by the following formula (PAG4);

(PAG3)

(PAG4)
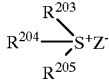

In the formula (PAG3), $Ar^1$ and $Ar^2$ each represent a substituted or unsubstituted aryl group. Suitable examples of such a substituent include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

In the formula (PAG4), $R^{203}$, $R^{204}$ and $R^{205}$ each represent a substituted or unsubstituted alkyl or aryl group. Preferred are an aryl group having 6 to 14 carbon atoms, an alkyl group having 1 to 8 carbon atoms, and substituted derivatives thereof. Preferable examples of the substituent for the aryl group include an alkoxy group having 1 to 8 carbon atoms, an alkyl group having 1 to 8 carbon atoms, a nitro group, a carboxyl group, a hydroxyl group and a halogen atom, and those for the alkyl group include an alkoxy group having 1 to 8 carbon atoms, a carboxyl group and an alkoxycarbonyl group.

In the above formulae, $Z^-$ is a counter anion, such as a perfluoroalkanesulfonic acid anion such as $CF_3SO_3^-$, or a pentafluorobenzenesulfonic acid anion.

Further, two of $R^{203}$, $R^{204}$ and $R^{205}$, and $Ar^1$ and $Ar^2$ may combine with each other via a single bond or a substituent.

Examples of such compounds are shown below, but the invention is not limited to those compounds.

(PAG3-1)
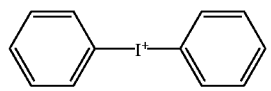 $CF_3SO_3^-$ (PAG3-2)
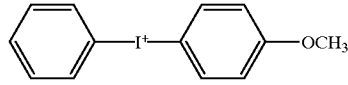 $CF_3SO_3^-$ (PAG3-3)
 $CF_3SO_3^-$ (PAG3-4)
 $CF_3SO_3^-$ (PAG3-5)
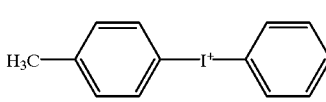 $CF_3SO_3^-$

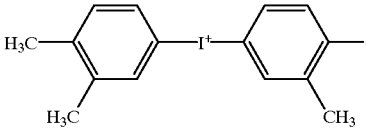 (PAG3-6) CF$_3$SO$_3^-$
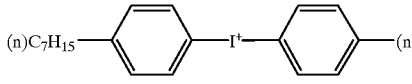 (PAG3-7) CF$_3$SO$_3^-$
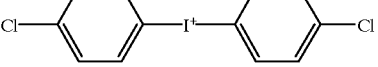 (PAG3-8) CF$_3$SO$_3^-$
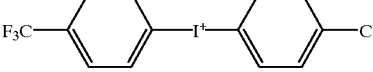 (PAG3-9) CF$_3$SO$_3^-$
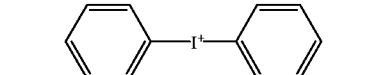 (PAG3-10) CF$_3$SO$_3^-$
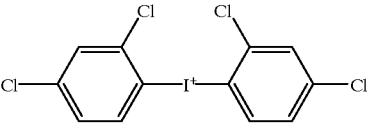 (PAG3-11) CF$_3$SO$_3^-$
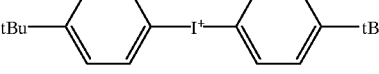 (PAG3-12) CF$_3$SO$_3^-$
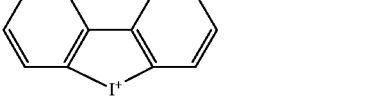 (PAG3-13) CF$_3$SO$_3^-$
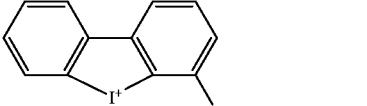 (PAG3-14) CF$_3$SO$_3^-$
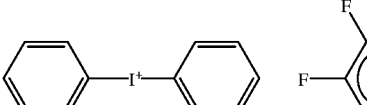 (PAG3-15) 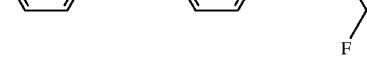
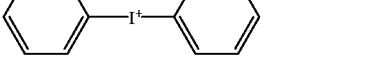 (PAG3-16) C$_8$F$_{17}$SO$_3^-$
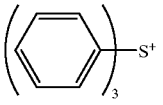 (PAG4-1) CF$_3$SO$_3^-$
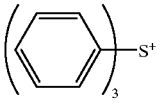 (PAG4-2) C$_8$F$_{17}$SO$_3^-$
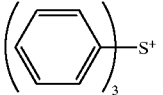 (PAG4-3) 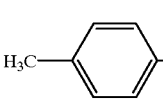
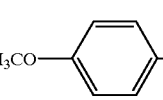 (PAG4-4) CF$_3$SO$_3^-$
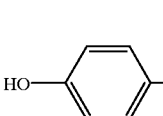 (PAG4-5) CF$_3$SO$_3^-$
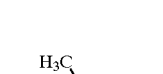 (PAG4-6) CF$_3$SO$_3^-$
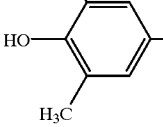 (PAG4-7) CF$_3$SO$_3^-$
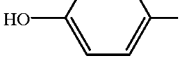 (PAG4-8) CF$_3$SO$_3^-$
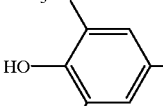 (PAG4-9) CF$_3$SO$_3^-$
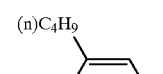 (PAG4-10) CF$_3$SO$_3^-$ -continued (PAG4-11)
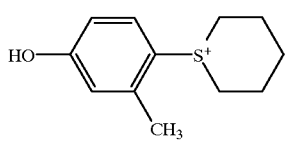
CF$_3$SO$_3^-$ (PAG4-12)
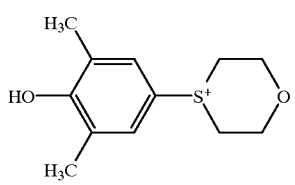
CF$_3$SO$_3^-$ (PAG4-13)
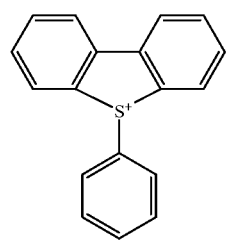
CF$_3$SO$_3^-$ (PAG4-14)
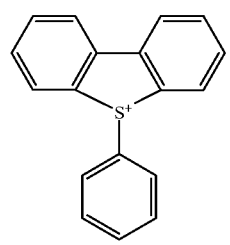
C$_8$F$_{17}$SO$_3^-$ (PAG4-15)
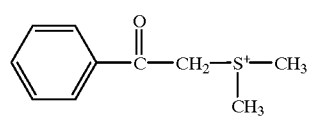
CF$_3$SO$_3^-$ (PAG4-16)
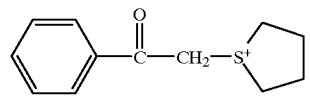
CF$_3$SO$_3^-$ (PAG4-17)
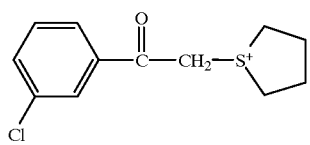
CF$_3$SO$_3^-$ (PAG4-18)
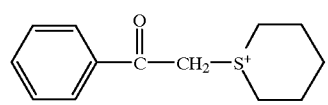
CF$_3$SO$_3^-$ (PAG4-19)
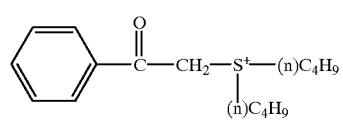
CF$_3$SO$_3^-$ -continued (PAG4-20)
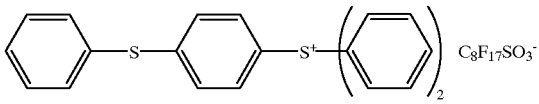
C$_8$F$_{17}$SO$_3^-$ (PAG4-21)
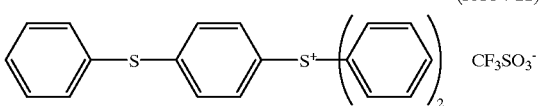
CF$_3$SO$_3^-$ (PAG4-22)
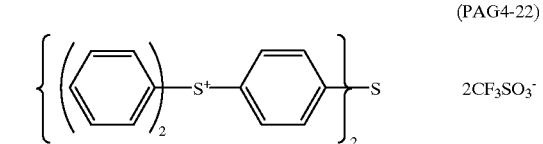
2CF$_3$SO$_3^-$ (PAG4-23)
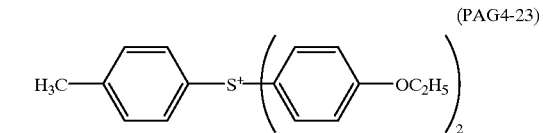

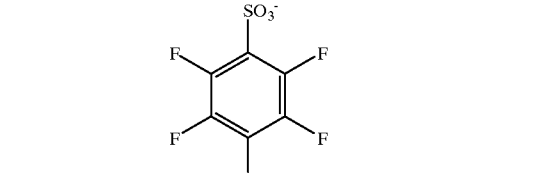

(PAG4-24)
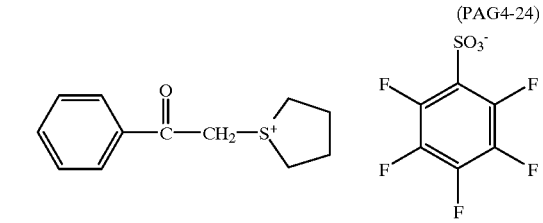

The above-described onium salts of formulae (PAG3) and (PAG4) are known compounds, and can be prepared using the methods described, e.g., in J. W. Knapczyk et al., *J. Am. Chem. Soc.*, 91, 145 (1969), A. L. Maycok et al., *J.Org.Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone compounds represented by the following formula (PAG5), or iminosulfonate compounds represented by the following formula (PAG6):

(PAG5)
Ar$^3$—SO$_2$—SO$_2$—Ar$^4$ (PAG6)
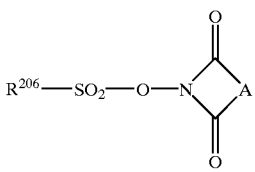

wherein Ar$^3$ and Ar$^4$ each represent a substituted or unsubstituted aryl group; R$^{206}$ represents a substituted or unsubstituted alkyl or aryl group; and A represents a substituted or unsubstituted alkylene, alkenylene or arylene group.

Examples of such compounds are shown below, but the invention is not limited to those compounds.
(PAG5-1)
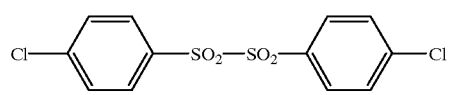
(PAG5-2)
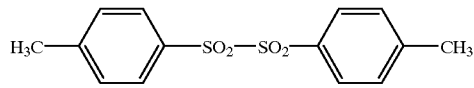
(PAG5-3)
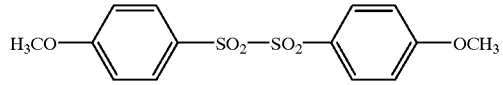
(PAG5-4)
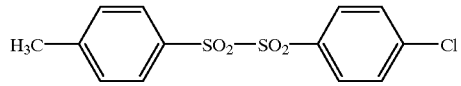
(PAG5-5)
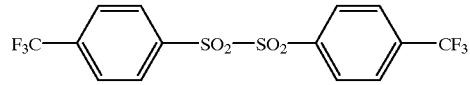
(PAG5-6)
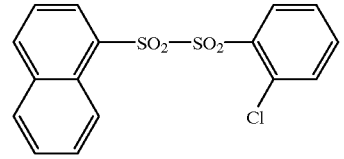
(PAG5-7)
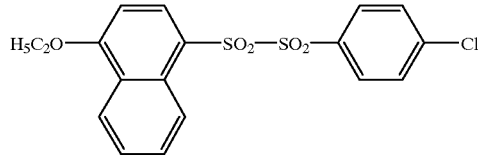
(PAG5-8)
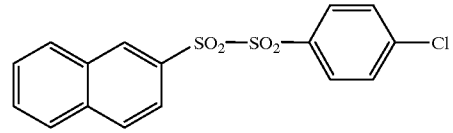
(PAG5-9)
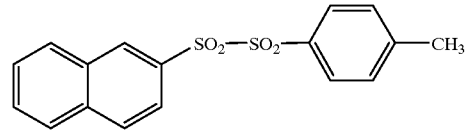
(PAG5-10)
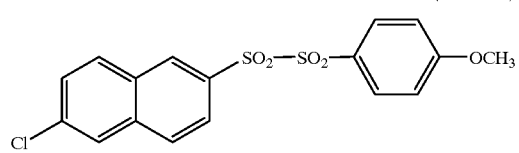
-continued
(PAG5-11)
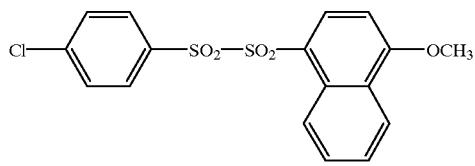
(PAG5-12)
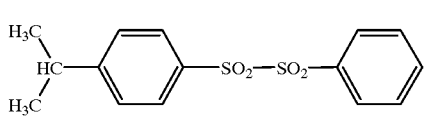
(PAG5-13)
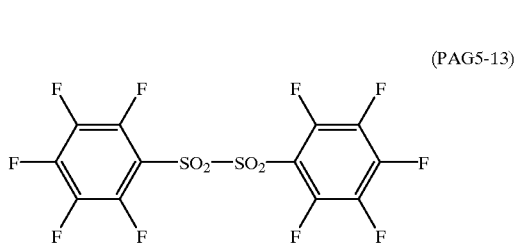
(PAG5-14)
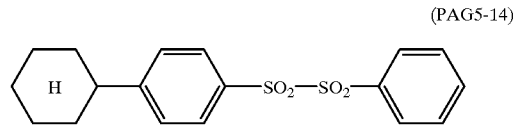
(PAG6-1)
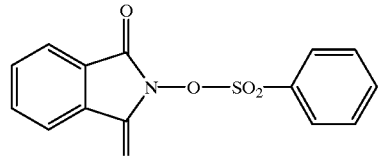
(PAG6-2)
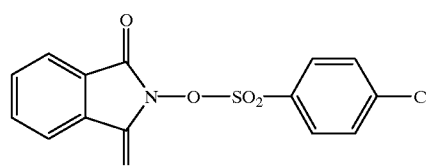
(PAG6-3)
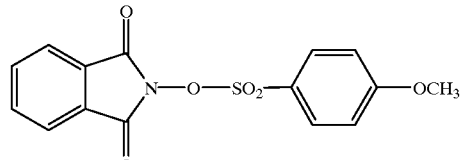
(PAG6-4)
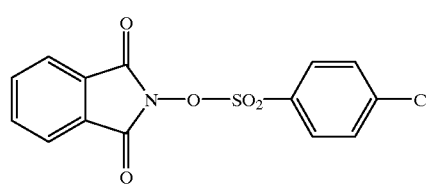

(PAG6-5), (PAG6-6), (PAG6-7), (PAG6-8), (PAG6-9), (PAG6-10), (PAG6-11), (PAG6-12), (PAG6-13), (PAG6-14)

The compound which lowers the solubility of alkali-soluble resins in a developer in the presence of an acid (hereinafter referred to as "crosslinking agent") used in the negative working photoresist composition of the present invention is explained below.

The crosslinking agent used in the present invention is a compound containing, in the molecule, a plurality of functional groups capable of reacting with the crosslinking groups in the alkali-soluble polymer in the presence of an acid catalyst to form a crosslinked polymer, thereby making the present alkali-soluble resin alkali-insoluble.

Such functional groups include a vinyl ether group and an epoxy group, and the compounds containing either or both of these groups are used.

Further, the compounds having slight absorption in the deep ultraviolet used as exposure light, particularly in the wavelength region of 170 to 220 nm, are particularly preferably be used.

Compounds represented by the following formulae [X], [XI] and [XII] are preferably used as the crosslinking agent in the present invention:

$$H_2C=HC-R-(O-CH=CH_2)_a \quad [X]$$

$$H_2C-HC-R'-(CH-CH_2)_b \quad [XI]$$
(with epoxide rings)

$$(H_2C-CH)-R''-(O-CH=CH_2)_a \quad [XII]$$
(with epoxide ring, subscript b)

wherein R, R' and R" each represent a divalent or higher organic group, and a and b each are an integer of 2 or above.

Examples of the organic group represented by R, R' and R" each include an alkylene group, a cycloalkylene group, an ether group, a thioether group, an ester group, an amido group, an urethane group, an ureido group and groups formed by combining two or more thereof.

Examples of such an alkylene group include those having 1 to 8 carbon atoms, such as ethylene, propylene, butylene and hexylene groups, and those divalent or more groups are preferable.

Examples of such a cycloalkylene group include monocyclo-, dicyclo- and tricycloalkylene groups having 5 to 20 carbon atoms, such as cyclopentylene, cyclohexylene, cyclooctylene, adamantylene and tricyclodecanylene groups, and those divalent or higher groups are preferable.

The above divlent or higher organic groups may have a substituent. Examples of such a substituent include a hydroxyl group, a halogen atom (e.g., fluorine, chlorine, bromine, iodine), a nitro group, a cyano group, an amido group, a sulfonamido group, an alkyl group having 1 to 8 carbon atoms which may have a substituent (e.g., methyl, ethyl, propyl, n-butyl, sec-butyl, hexyl, 2-ethylhexyl, octyl), an alkoxy group having 1 to 8 carbon atoms which may have a substituent (e.g., methoxy, ethoxy, hydroxyethoxy, propoxy, hydroxypropoxy, butoxy), an alkoxycarbonyl group (e.g., methoxycarbonyl, ethoxycarbonyl), an acyl group (e.g., formyl, acetyl) and an acyloxy group (e.g., acetoxy, butyryloxy).

Of those compounds, compounds particularly having cycloalkylene groups as R, R' and R" are preferred from the viewpoint of imparting dry etching resistance.

Specific examples of a vinyl ether group-containing compound are shown below:

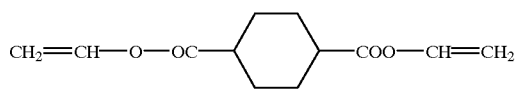
(d13)
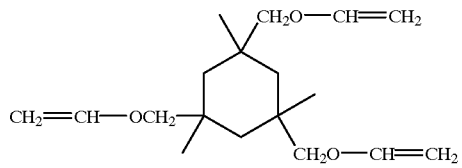
(d14)
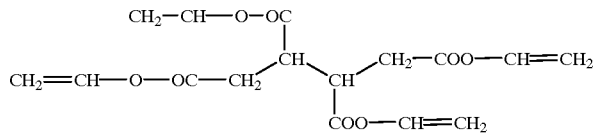
(d15)
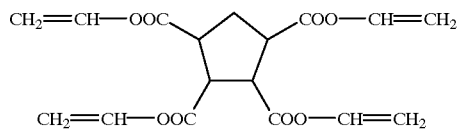
(d16)
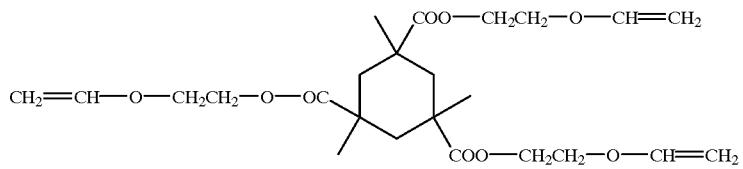
(d17)
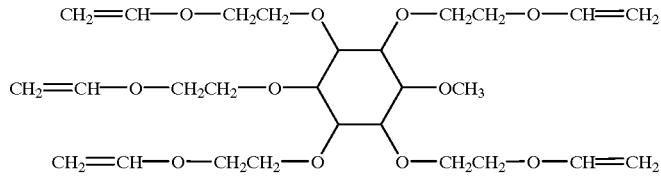
(d18)
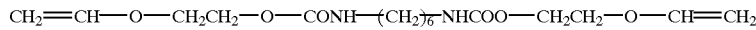
(d19)
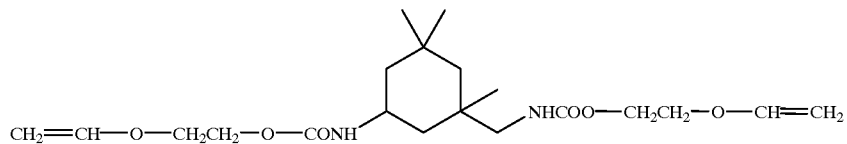
(d20)
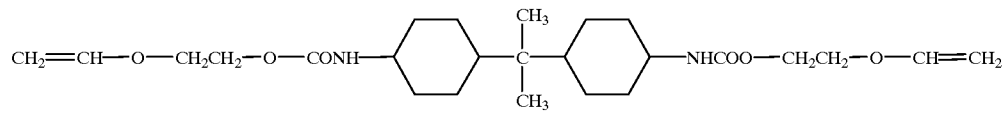
(d21)
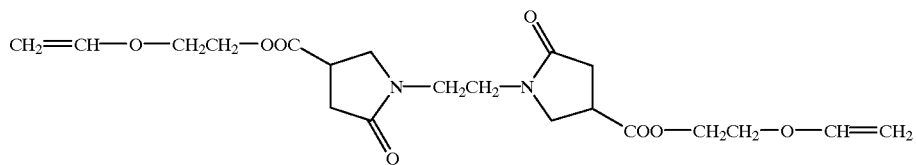
(d22)

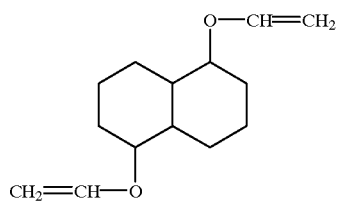
(d23)
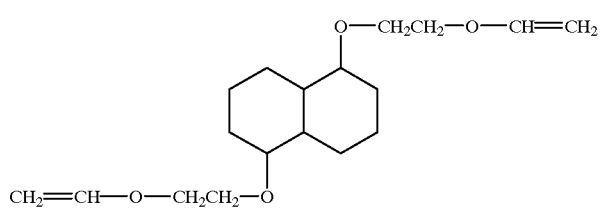
(d24)
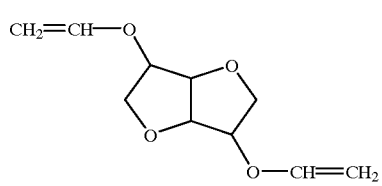
(d25)
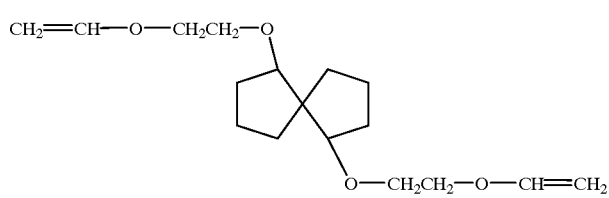
(d26)
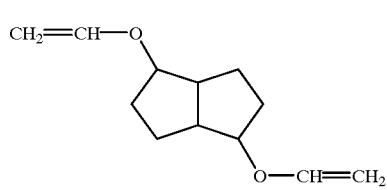
(d27)
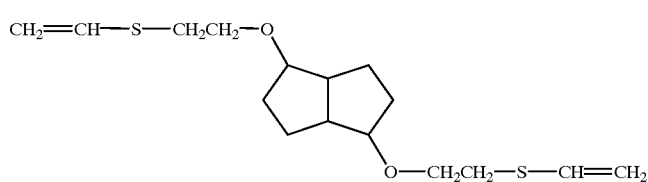
(d28)
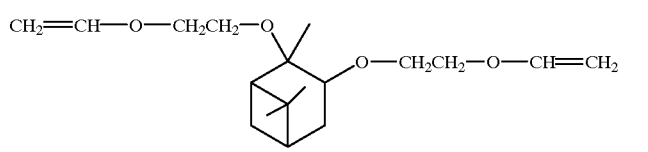
(d29)
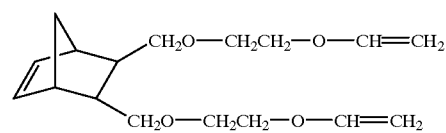
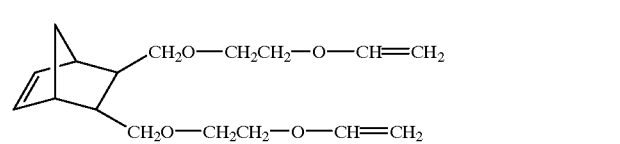
(d30)

(d31)
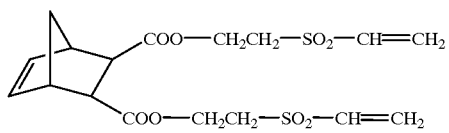
(d32)
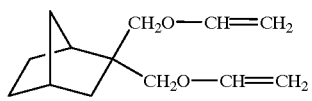
(d33)
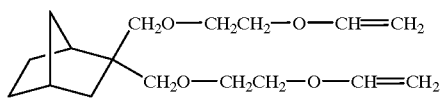
(d34)
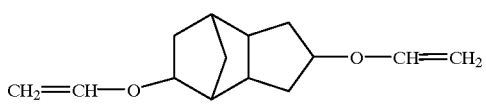
(d35)
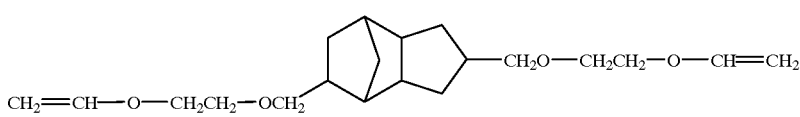
(d36)
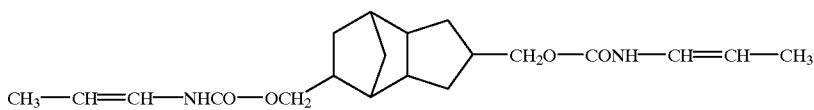
(d37)
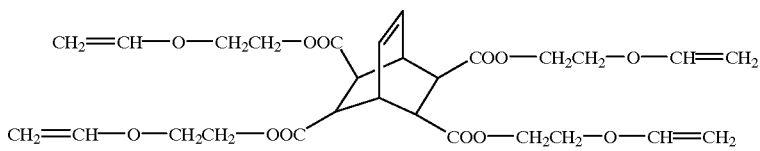
(d38)
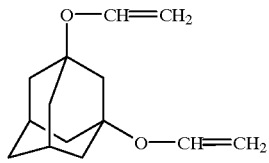
(d39)
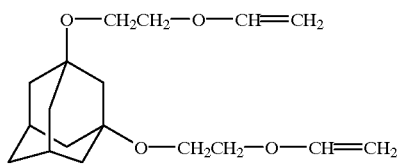
(d40)
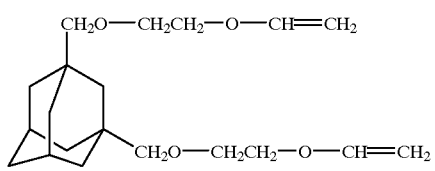

-continued

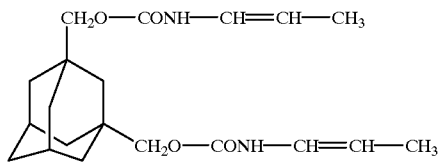
(d41)

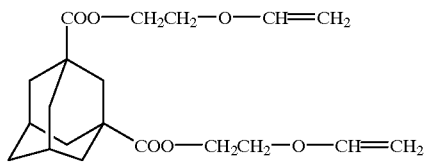
(d42)

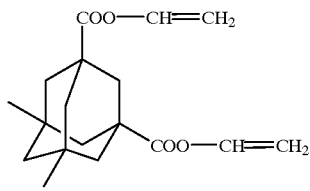
(d43)

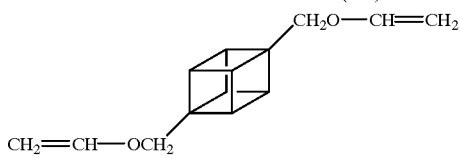
(d44)

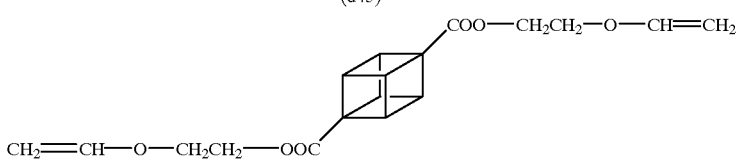
(d45)

Examples of an epoxy group-containing compound include an epoxy group-containing cyclic ether compound, an epoxy group-containing cyclic lactone compound, an epoxy group-containing cyclic acetal compound, an epoxy group-containing cyclic thioether compound, epoxy group-containing spiro-orthoester compounds, and vinyl compounds. Those compounds can be used alone or as mixtures of two or more thereof. Of these compounds, compounds having at least one epoxy group in the molecule, for example, conventional alicyclic epoxy resins and aliphatic epoxy resins, are preferable.

Suitable examples of such an alicyclic epoxy resin include polyglycidyl ether of a polyhydric alcohol having at least one aliphatic group, and a cyclohexene oxide- or cyclopentene oxide-containing compounds obtained by epoxidation of a cyclohexene or cyclopentene ring-containing compound with an appropriate oxidizing agent, such as hydrogen peroxide or a peroxy acid. Representative examples of the alicyclic epoxy resin include hydrogenated bisphenol A diglycidyl ether, 3,4-epoxycyclohexylmethyl-3,4-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinylcyclohexene dioxide, 4-vinylepoxycyclohexane, bis(3,4-epoxy-6-methylcyclohexylmethyl)adipate, 3,4-epoxy-6-methylcyclohexyl-3,4-epoxy-6-methylcyclohexane carboxylate, methylenebis(3,4-epoxycyclohexane), dicyclopentadiene diepoxide, ethylene glycol di(3,4-epoxycyclohexylmethyl) ether, ethylenebis(3,4-epoxycyclohexane carboxylate), dioctyl epoxyhexahydrophthalate and di-2-ethylhexyl epoxyhexahydrophthalate.

Suitable examples of the aliphatic epoxy resin include polyglycidyl ether of an aliphatic polyhydric alcohol or an alkylene oxide adduct thereof, polyglycidyl ester of an aliphatic long-chain polybasic acid, and a homo- or co-polymer of glycidyl acrylate or glycidiyl methacrylate. Representative examples thereof include diglycidyl ether of 1,4-butanediol, diglycidyl ether of 1,6-hexanediol, triglycidyl ether of glycerine, triglycidyl ether of trimethylolpropane, diglycidyl ether of polyethylene glycol, diglycidyl ether of polypropylene glycol, polyglycidyl ether of a polyetherpolyol prepared by the addition of at least one alkylene oxide to an aliphatic polyhydric alcohol, such as ethylene glycol, propylene glycol or glycerine, and diglycidyl ester of an aliphatic long-chain dibasic acid. Additional examples thereof include monoglycidyl ether of an aliphatic higher alcohol, monoglycidyl ether of a polyether alcohol prepared by the addition of an alkylene oxide to phenol, cresol, butylphenol or an aliphatic higher alcohol, glycidyl ester of a higher fatty acid, epoxidated soybean oil, butyl epoxystearate, octyl epoxystearate, epoxidated linseed oil and epoxidated polybutadiene.

In the present invention, the amount of the crosslinking agent added in the negative working photoresist composition is 4 to 55% by weight, preferably 8 to 50% by weight, and more preferably 10 to 45% by weight %, based on the weight of the total solid content of the composition.

The composition of the present invention is advantageously used by dissolving the same in a specific solvent. The solvent may be any of organic solvents so long as they can sufficiently dissolve all the solid components and the solutions obtained can form uniform films by the conventional coating method, such as a spin coating method. Such solvents may be used alone or as a mixture of two or more thereof.

Examples of such a solvent include n-propyl alcohol, isopropyl alcohol, n-butyl alcohol, t-butyl alcohol, methyl cellosolve acetate, ethyl cellosolve acetate, propylene glycol monoethylether acetate, methyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, diethylene glycol dimethyl ether and 2-heptanone. However, the invention is not limited to those compounds.

The negative working photoresist composition of the present invention may further contain other components, such as a surfactant, a coloring matter, a stabilizer, a coatability improver and a dye, if necessary.

The negative working photoresist composition of the present invention is coated on a substrate to form a thin film, and the thin film is subjected to pattern exposure, heat treatment and then development-processing. It is desirable for the coated thin film to have a thickness of 0.4–1.5 μm. The suitable exposure means are those capable of emitting light in the wavelength range of 170–220 nm. In particular, ArF excimer laser stepper is particularly preferable. After exposure, the heat temperature is generally conducted at a heating temperature of 90–150° C. for 30 seconds to 10 minutes.

The present invention will be described in greater detail by reference to the following examples. However, the invention should not be construed as being limited to these examples.

SYNTHESIS EXAMPLES (1) Syntheses of Resin A (repeating unit [I-2], [II-2]; Ring-Opening Polymerization):

A 50:50 molar ratio mixture of 5-norbornene-2,3-dicarboxylic anhydride and a reaction product of this 5-norbornene-2,3-dicarboxylic anhydride with cyclopentadiene was dissolved in dry chlorobenzene, and the resulting solution was added to a dry chlorobenzene solution containing 0.1 mole % of tungsten hexachloride and 0.3 mole % of triethyl aluminum, followed by stirring. After the stirring was continued at 30° C. for 18 hours, a white acid anhydride resin was taken out by reprecipitating with methanol.

This precipitate was then hydrolyzed under an acidic condition in the presence of methanol to obtain the intended Resin A.

As a result of GPC measurement of Resin A, Resin A was found to have a weight average molecular weight of 16400 based on the standard polyhydroxystyrene conversion.

Resins B to J having repeating units shown below were synthesized by the same ring-opening polymerization method as described above.

TABLE 1

| Resin | Repeating unit 1 (Molar ratio) | Repeating unit 2 (Molar ratio) | Repeating unit 3 (Molar ratio) | Weight average molecular weight |
|---|---|---|---|---|
| B | I-7 (0.5) | II-7 (0.5) | | 16,600 |
| C | I-12 (0.5) | II-12 (0.4) | IV-17 (0.1) | 18,100 |
| D | I-11 (0.5) | III-18 (0.4) | IV-16 (0.1) | 16,300 |
| E | III-16 (0.5) | IV-26 (0.5) | | 17,600 |
| F | III-24 (0.5) | IV-16 (0.1) | IV-31 (0.4) | 15,400 |
| G | I-10 (0.5) | IV-24 (0.5) | | 15,100 |
| H | I-17 (0.5) | IV-16 (0.4) | VI-7 (0.1) | 14,700 |
| I | II-12 (0.5) | III-24 (0.4) | V-5 (0.1) | 16,200 |
| J | III-25 (0.4) | III-18 (0.1) | IV-18 (0.5) | 13,500 |

(2) Syntheses of Resin L (Repeating Unit [I'-51]):

100 g of 5-norbornene-2,3-dicarboxylic acid anhydride and 5 g of a catalyst of formula $[Pd(CH_3CN)_4](BF_4)_2$ synthesized by the method described in *Journal of Organometallic Chemistry*, 1988, vol. 358, pp. 567–588, were dissolved in nitromethane, and stirred at room temperature for 6 hours. The reaction solution obtained was concentrated to yield a solid, and the solid was washed with acetonitrile/water solvent to obtain a white resin.

This resin was reacted for 10 hours under a basic condition while dispersing it into 2-cyanoethanol, and then neutralized with dilute hydrochloric acid to precipitate a white resin. This white resin was taken out by filtration. The thus obtained resin is hereinafter referred to as "Resin L".

As a result of GPC measurement, the weight average molecular weight of Resin L was found to be 8400 based on the standard polyhydroxystyrene conversion.

Resins M to R having the repeating units shown below were synthesized in the same polymerization method as described above.

TABLE 2

| Resin | Repeating unit 1 (molar ratio) | Repeating unit 2 (molar ratio) | Repeating unit 3 (molar ratio) | Weight average molecular weight |
|---|---|---|---|---|
| M | [I'-41] (0.3) | [I'-47] (0.3) | [II'-47] (0.4) | 7,700 |
| N | [I'-52] (0.6) | [III'-49] (0.4) | | 8,200 |
| O | [I'-41] (0.2) | [I'-57] (0.5) | [IV'-56] (0.3) | 7,200 |
| P | [II'-52] (0.5) | [III'-48] (0.2) | [III'-49] (0.3) | 8,600 |
| Q | [II'-3] (0.4) | [III'-48] (0.3) | [V'-14] (0.3) | 7,200 |
| R | [I'-58] (0.4) | [II'-41] (0.4) | [III'-46] (0.2) | 9,200 |

EXAMPLES 1 TO 17 AND COMPARATIVE EXAMPLES 1 TO 4

1.2 g of each of Resins A to R synthesized in the above Synthesis Examples, 0.25 g of triphenylsulfonium triflate and 0.3 g of each of the crosslinking agents as shown in Table 1 were dissolved in propylene glycol monoethylether acetate such that the resulting solution had the total solid content of 14% by weight, and filtered through a 0.1 μm microfilter. Thus, a negative working photoresist composition solution was prepared.

Evaluation Test:

Each of the negative working composition solutions obtained was coated on a silicon wafer with a spin coater, and dried at 120° C. for 90 seconds to form a negative working photoresist film having a thickness of about 0.5 μm. Each of the photoresist films formed was exposed with an ArF excimer laser (193 nm). After the exposure, the film was heated at 110° C. for 90 seconds, developed with a 2.38% aqueous solution of tetramethylammonium hydroxide, and then rinsed with distilled water to obtain a resist pattern profile.

(1) Pattern Profile:

The resist pattern profiles obtained were observed with a scanning electron microscope, and the profile evaluation was made by the profile of a 0.25 micron pattern. The evaluation results are shown in Table 3, wherein the mark ○ symbolizes that the profile of a 0.25 micron pattern has a rectangular form and the mark x symbolizes that the profile of a 0.25 micron pattern has a tapered form or the top thereof has a T- or round shape.

(2) Adhesiveness to Substrate (Width of Finest Line Remaining on Substrate):

The resist pattern profiles obtained above were observed with a scanning electron microscope, and evaluation was made with width of the residual finest line. The width of the residual finest line is shown as (μm). The resist film having higher adhesiveness can retain the finer line pattern on the substrate. On the other hand, a resist film having poor adhesiveness can not adhere at the substrate interface as the width of fine line becomes small, so that the pattern peels off.

TABLE 3

| | Resin | Cross-linking agent | Adhesiveness to substrate | Profile |
|---|---|---|---|---|
| Example 1 | A | d0 | 0.20 | ○ |
| Example 2 | B | d4 | 0.20 | ○ |
| Example 3 | C | d18 | 0.20 | ○ |
| Example 4 | D | d35 | 0.20 | ○ |
| Example 5 | E | d0 | 0.20 | ○ |
| Example 6 | F | d' 1 | 0.20 | ○ |
| Example 7 | G | d' 1 | 0.20 | ○ |
| Example 8 | H | d' 2 | 0.22 | ○ |
| Example 9 | I | d' 4 | 0.20 | ○ |
| Example 10 | J | d0 | 0.20 | ○ |
| Example 11 | L | d0 | 0.20 | ○ |
| Example 12 | M | d0 | 0.20 | ○ |
| Example 13 | N | d5 | 0.20 | ○ |
| Example 14 | O | d23 | 0.20 | ○ |
| Example 15 | P | d' 1 | 0.20 | ○ |
| Example 16 | Q | d' 3 | 0.22 | ○ |
| Example 17 | R | d' 5 | 0.20 | ○ |
| Comparative Example 1 | X1 | e2 | 0.35 | X |
| Comparative Example 2 | X2 | e1 | 0.37 | X |
| Comparative Example 3 | X2 | d0 | 0.38 | X |
| Comparative Example 4 | X2 | d' 1 | 0.4 | X |

In Table 3, the symbols for the crosslinking agents show the following compounds.

d' 1: Hydrogenated bisphenol A glycidyl ether
d' 2: Ethylene glycol di(3,4-epoxycyclohexylmethyl)ether
d' 3: Dicyclopentadiene diepoxide
d' 4: 4-Vinylepoxycyclohexane
d' 5: Vinylcyclohexene dioxide
e1: 4,4'-Diazidobiphenyl
e2: Hexamethylolmelamine Further, the symbols for the comparative resins in Table 3 show the following polymers.

X1: Polyhydroxystyrene (VP-8000, a product of Nippon Soda Co., Ltd.)

X2: The copolymer of vinyl methacrylate, N-methyl methacryl amide, methacrylic acid and methacrylic acid adamantine (8/23/40/50 by copolymerization molar ratio) having the weight average molecular weight of 18,200 (based on the standard polystyrene conversion) synthesized by the method described in Example 1 at column 15 on page 9 of JP-A-8-262717.

As can be seen from Table 3, the Comparative Examples involve the problems on adhesiveness to a substrate and pattern profile. On the other hand, the negative photoresist working compositions of the present invention are on satisfactory levels on those items. In other words, the negative working photoresist compositions according to the present invention are suitable for lithography using far ultraviolet rays, including ArF excimer laser beam.

As described above, the present invention can provide negative working photoresist compositions that are sufficiently suitable to exposure with far ultraviolet rays, particularly light in the wavelength range of 170–220 nm, have high adhesiveness to a substrate and high sensitivity, and form resist patterns having excellent profiles.

While the invention has been described in detail and with reference to specific embodiments thereof, it will be apparent to one skilled in the art that various changes and modifications can be made therein without departing from the spirit and scope thereof.

What is claimed is:

1. A negative working photoresist composition comprising:

an alkali-soluble resin, a compound capable of generating an acid upon irradiation with actinic rays or radiations, and a compound capable of lowering the solubility of the alkali-soluble resin in a developer in the presence of the acid, wherein the alkali-soluble resin comprises a polymer containing at least one of the repeating units represented by the following formulae [I] and [II], and crosslinking groups:

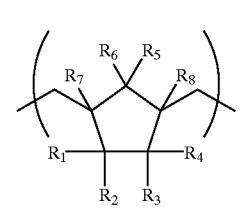

[I]

-continued

[II]

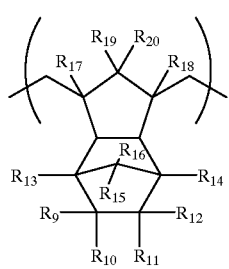

wherein $R_1$ to $R_4$ and $R_9$ to $R_{12}$ each independently represent a hydrogen atom, an alkyl group which may have substituents, a halogen atom, a hydroxyl group, an alkoxy group which may have substituents, —COOH, —COOR$_{41}$, —CN or —CO—X—A—R$_{50}$;
$R_5$ to $R_8$ and $R_{13}$ to $R_{20}$ each independently represent a hydrogen atom, an alkyl group which may have substituents, or an alkoxy group which may have substituents;
$R_{41}$ represents an alkyl group which may have substituents, or —Y of the following formula:

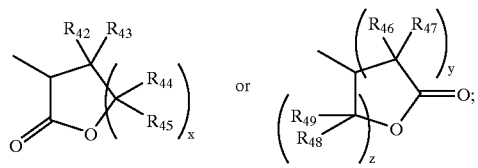

$R_{42}$ to $R_{49}$ each independently represent a hydrogen atom or an alkyl group which may have substituents;
X represents a divalent linkage group selected from the group consisting of —O—, —S—, —NH—, —NHSO$_2$— and —NHSO$_2$NH—;
A represents a single bond or a group selected from the group consisting of an alkylene group, a substituted alkylene group, an ether group, a thioether group, a carbonyl group, an ester group, an amido group, a sulfonamido group, an urethane group and a urea group, or a combination of two or more of those groups;
$R_{50}$ represents a hydrogen atom, an alkyl group, a cycloalkyl group, —COOH, —CN, a hydroxyl group, an unsubstituted or substituted alkoxy group, —CO—NH—R$_{30}$, —CO—NH—SO$_2$—R$_{30}$, —COOR$_{35}$ or the above-described Y;
$R_{30}$ represents an alkyl group which may have substituents, or an alkoxy group which may have substituents;
$R_{35}$ represents an alkyl group which may have substituents, an alkoxy group which may have substituents, or the above-described Y; and
x, y and z are each 1 or 2.

2. A negative working photoresist composition comprising:
  an alkali-soluble resin;
  a compound capable of generating an acid upon irradiation with actinic rays or radiations, and
  a compound capable of lowering the solubility of the alkali-soluble resin in a developer in the presence of the acid, wherein the alkali-soluble resin comprises a polymer containing at least one of the repeating units represented by the following formulae (I') and (II'), and crosslinking groups:

[I']

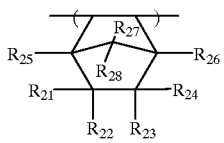

[II']

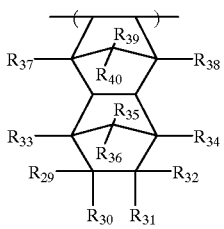

wherein $R_{21}$ to $R_{24}$ and $R_{29}$ to $R_{32}$ each independently represent a hydrogen atom, an alkyl group, a halogen atom which may have substituents, a hydroxyl group, an alkoxy group which may have substituents, —COOH, —COOR$_{41}$, —CN or —CO—X—A—R$_{50}$;
$R_{25}$ to $R_{28}$ and $R_{33}$ to $R_{40}$ each independently represent a hydrogen atom, an alkyl group which may have substituents, or an alkoxy group which may have substituents;
$R_{41}$ represents an alkyl group which may have substituents, or —Y of the following formula:

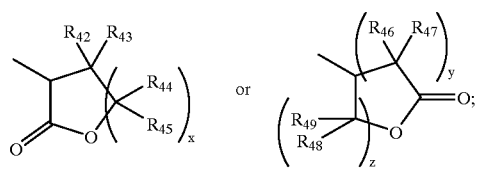

$R_{42}$ to $R_{49}$ each independently represent a hydrogen atom or an alkyl group which may have substituents;
X represents a divalent linkage group selected from the group consisting of —O—, —S—, —NH—, —NHSO$_2$— and —NHSO$_2$NH—;
A represents a single bond or a group selected from the group consisting of an alkylene group, a substituted alkylene group, an ether group, a thioether group, a carbonyl group, an ester group, an amido group, a sulfonamido group, an urethane group and an urea group, or a combination of two or more of those groups; $R_{50}$ represents a hydrogen atom, an alkyl group, a cycloalkyl group, —COOH, —CN, a hydroxyl group, an unsubstituted or substituted alkoxy group, —CO—NH—R$_{51}$, —CO—NH—SO$_2$—R$_{51}$, —COOR$_{52}$ or the above Y; $R_{51}$ represents an alkyl group which may have substituents or an alkoxy group which may have substituents; $R_{52}$ represents an alkyl group which may have substituents, an alkoxy group which may have substituents or the above-described Y: and x, y and z are each 1 or 2.

* * * * *